(12) United States Patent
Shigematsu et al.

(10) Patent No.: US 8,325,324 B2
(45) Date of Patent: Dec. 4, 2012

(54) ILLUMINATING OPTICAL APPARATUS, EXPOSURE APPARATUS AND DEVICE MANUFACTURING METHOD

(75) Inventors: Koji Shigematsu, Kawasaki (JP); Osamu Tanitsu, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1012 days.

(21) Appl. No.: 12/252,586

(22) Filed: Oct. 16, 2008

(65) Prior Publication Data

US 2009/0040490 A1   Feb. 12, 2009

Related U.S. Application Data

(63) Continuation of application No. PCT/JP2007/063643, filed on Jul. 9, 2007.

(30) Foreign Application Priority Data

Jul. 12, 2006   (JP) .................................. 2006-191346

(51) Int. Cl.
  G03B 27/54   (2006.01)
  G03B 27/42   (2006.01)
(52) U.S. Cl. .......................................... 355/67; 355/53
(58) Field of Classification Search ................ 355/52, 355/53, 55, 67–71
  See application file for complete search history.

(56) References Cited

U.S. PATENT DOCUMENTS

| | | | |
|---|---|---|---|
| 4,937,459 A | 6/1990 | Ina | |
| 5,863,677 A * | 1/1999 | Nakao | 430/5 |
| 6,597,430 B1 * | 7/2003 | Nishi et al. | 355/53 |
| 7,884,921 B2 | 2/2011 | Noboru et al. | |
| 7,924,406 B2 * | 4/2011 | Loopstra et al. | 355/67 |
| 2002/0085276 A1 | 7/2002 | Tanitsu et al. | |
| 2004/0263817 A1 | 12/2004 | Tanitsu et al. | |
| 2007/0242249 A1 | 10/2007 | Shibazaki et al. | |
| 2008/0259440 A1 | 10/2008 | Omura | |

FOREIGN PATENT DOCUMENTS

| | | |
|---|---|---|
| EP | 1 255 162 A1 | 11/2002 |
| EP | 1 993 120 A1 | 11/2008 |
| JP | A-61-134022 | 6/1986 |
| JP | A-06-124873 | 5/1994 |

(Continued)

OTHER PUBLICATIONS

Mar. 1, 2012 Office Action issued in Japanese Application No. 2008-524782 (with translation).

(Continued)

*Primary Examiner* — Hung Henry Nguyen
(74) *Attorney, Agent, or Firm* — Oliff & Berridge, PLC

(57) ABSTRACT

An illumination optical apparatus is able to quickly perform switching of illumination conditions between illumination in a first region and illumination in a second region. The illumination optical apparatus of the present invention to illuminate an illumination target surface on the basis of light from a light source comprises: a path switching member arranged in an optical path between the light source and the illumination target surface and switching an optical path of an exiting beam between a first optical path and a second optical path; a path combining member combining the first optical path and the second optical path; a first pupil distribution forming member arranged in the first optical path and forming a predetermined light intensity distribution on an illumination pupil; and a second pupil distribution forming member arranged in the second optical path and forming a predetermined light intensity distribution on the illumination pupil.

31 Claims, 15 Drawing Sheets

FOREIGN PATENT DOCUMENTS

| | | |
|---|---|---|
| JP | A-08-313842 | 11/1996 |
| JP | A-10-303114 | 11/1998 |
| JP | A-2000-021748 | 1/2000 |
| JP | A-2002-231619 | 8/2002 |
| JP | A-2004-304135 | 10/2004 |
| JP | A-2005-236088 | 9/2005 |
| JP | A-2006-013449 | 1/2006 |
| JP | A-2007-027732 | 2/2007 |
| WO | WO 99-49504 | 9/1999 |
| WO | WO 2007/119839 A1 | 10/2007 |

OTHER PUBLICATIONS

Jan. 6, 2012 European Search Report issued in European Application No. 07768367.0.

Jan. 6, 2012 European Search Report issued in Application No. EP 07 76 8367.0.

* cited by examiner (a)

(b)

(a)

(b)

ILLUMINATING OPTICAL APPARATUS, EXPOSURE APPARATUS AND DEVICE MANUFACTURING METHOD

CROSS-REFERENCE TO RELATED APPLICATIONS

This is a continuation application of a PCT application No. PCT/JP2007/063643 filed on Jul. 9, 2007, claiming the benefit of priorities from Japanese Patent application No. 2006-191346 filed on Jul. 12, 2006, and incorporated by reference in their entirety.

BACKGROUND

1. Field

The present invention relates to illumination optical apparatus, exposure apparatus, and device manufacturing methods and, more particularly, to an illumination optical apparatus suitable for an exposure apparatus for manufacturing such devices as semiconductor devices, imaging devices, liquid-crystal display devices, and thin-film magnetic heads by a lithography process.

2. Description of the Related Art

The photolithography process for manufacturing the semiconductor devices and others is carried out using an exposure apparatus for projecting a pattern image of a mask (or reticle) through a projection optical system onto a photosensitive substrate (a wafer, a glass plate, or the like coated with a photoresist) to effect an exposure thereof. The ordinary exposure apparatus is arranged to form a pattern of one kind in one shot area (unit exposure region) on the photosensitive substrate.

In contrast to it, a method proposed for improvement in throughput is a double exposure method of effecting exposures of patterns of two kinds in a superimposed state in one shot area on a photosensitive substrate to form one synthetic pattern (cf. Japanese Patent Application Laid-open No. 2000-21748).

The exposure apparatus of the double exposure method is arranged, for example, as follows: a first pattern region on the mask is illuminated under a first illumination condition to transfer a pattern in the first pattern region into one shot area on the photosensitive substrate, and thereafter a second pattern region on the mask is illuminated under a second illumination condition to transfer a pattern in the second pattern region into the same shot area on the photosensitive substrate. In order to improve the throughput of the exposure apparatus, it is necessary to quickly perform switching of the illumination conditions between the illumination in the first pattern region and the illumination in the second pattern region.

SUMMARY

An object of the present invention is to provide an illumination optical apparatus capable of quickly performing switching of illumination conditions between illumination in a first region and illumination in a second region, Another object of the present invention is to provide an exposure apparatus capable of performing an exposure of a fine pattern at high throughput on a photosensitive substrate by the double exposure method, using the illumination optical apparatus quickly performing the switching of illumination conditions between the illumination in the first region and the illumination in the second region.

A first embodiment of the present invention provides an illumination optical apparatus to illuminate an illumination target surface, comprising:

a path switching member arranged in a path of illumination light and switching an optical path of an exiting beam between a first optical path and a second optical path;

a path combining member arranged at an end of the first optical path and an end of the second optical path and combining the first optical path and the second optical path;

a first pupil distribution forming member arranged in the first optical path and forming a predetermined light intensity distribution on an illumination pupil; and a second pupil distribution forming member arranged in the second optical path and forming a predetermined light intensity distribution on the illumination pupil.

A second embodiment of the present invention provides another illumination optical apparatus to illuminate an illumination target surface, comprising:

a beam separating member arranged in a path of an incident beam and separating an incident beam into a first beam traveling along a first optical path and a second beam traveling along a second optical path;

a path combining member arranged at an end of the first optical path and an end of the second optical path and combining the first optical path and the second optical path;

a first pupil distribution forming member arranged in the first optical path and forming a predetermined light intensity distribution on an illumination pupil;

a second pupil distribution forming member arranged in the second optical path and forming a predetermined light intensity distribution on the illumination pupil; and a shutter member shutting out either one of the first beam and the second beam as occasion demands.

A third embodiment of the present invention provides an exposure apparatus comprising the illumination optical apparatus of the first aspect or the second aspect and performing an exposure of a predetermined pattern illuminated by the illumination optical apparatus, on a photosensitive substrate.

A fourth aspect of the present invention provides a device manufacturing method comprising: effecting the exposure of the predetermined pattern on the photosensitive substrate, using the exposure apparatus of the third embodiment; and developing the photosensitive substrate after the exposing the predetermined pattern.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION OF THE EMBODIMENTS

Figure 1:
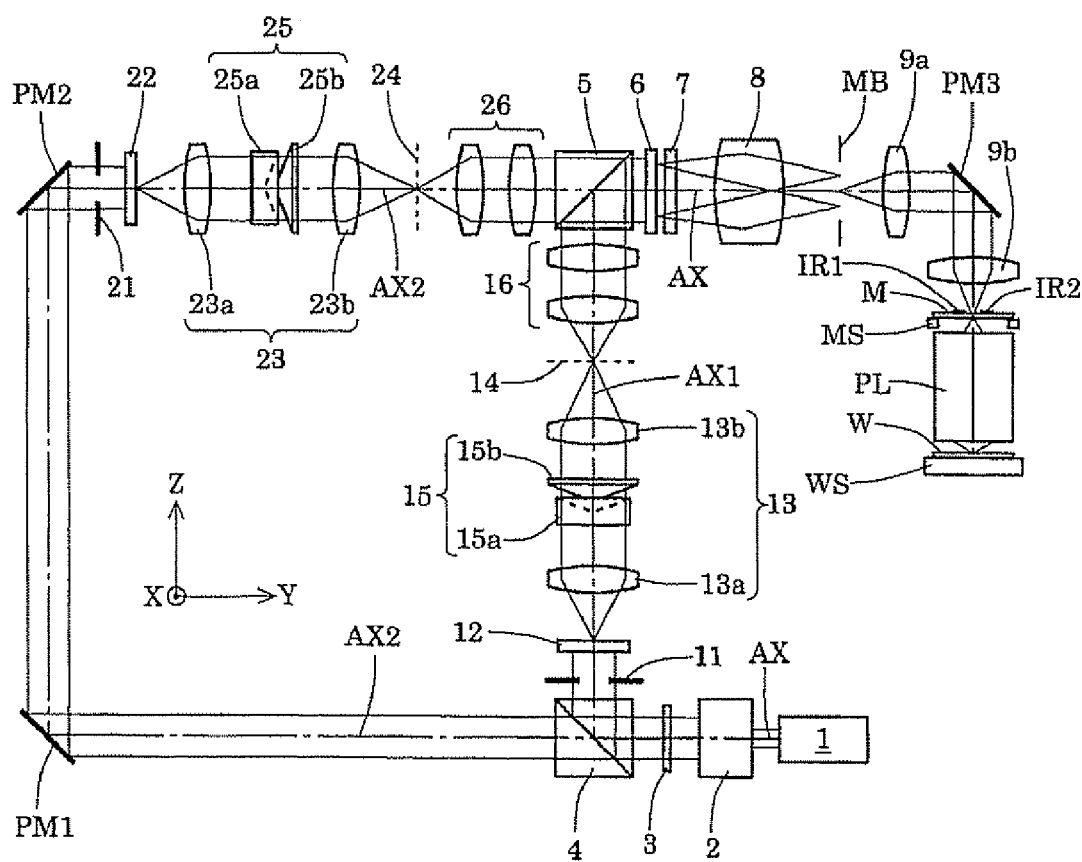
FIG. 1 is a drawing schematically showing a configuration of an exposure apparatus according to a first embodiment of the present invention.

Embodiments of the present invention will be described on the basis of the accompanying drawings. FIG. 1 is a drawing schematically showing a configuration of an exposure apparatus according to the first embodiment of the present invention. In FIG. 1, the Z-axis is set along a direction of a normal to a wafer W being a photosensitive substrate, the Y-axis along a direction parallel to the plane of FIG. 1 in a surface of the wafer W, and the X-axis along a direction normal to the plane of FIG. 1 in the surface of the wafer W. With reference to FIG. 1, the exposure apparatus of the first embodiment is provided with a light source 1 for supplying exposure light (illumination light).

The light source 1 applicable herein is, for example, an ArF excimer laser light source which supplies light with the wavelength of about 193 nm or a KrF excimer laser light source which supplies light with the wavelength of about 248 mm. A beam emitted along the optical axis AX from the light source 1 is expanded into a beam of a required sectional shape by a shaping optical system 2 and the expanded beam travels through a half wave plate 3 rotatable around the optical axis AX, to enter a polarization beam splitter 4. The half wave plate 3 converts linearly polarized light incident thereinto from the shaping optical system 2, into linearly polarized light with polarization in any direction and guides the resulting light to the polarization beam splitter 4.

s-polarized light reflected by the polarization beam splitter 4, i.e., light in a linearly polarized state with polarization in the X-direction (which will be referred to hereinafter as "X-directionally linearly polarized state") is guided into a first optical path, while p-polarized light transmitted by the polarization beam splitter 4, i.e., light in a linearly polarized state with polarization in the Z-direction (which will be referred to hereinafter as "Z-directionally linearly polarized state") is guided into a second optical path. The first beam reflected by the polarization beam splitter 4 and guided along the first optical path travels through a shutter member 11 and a diffractive optical element 12 for dipolar illumination to enter an afocal lens 13.

The shutter member 11 has a function to shut out the first beam traveling from the polarization beam splitter 4 to the diffractive optical element 12, as occasion demands. The afocal lens 13 is an afocal system (afocal optic) so set that a front focus position of its front lens unit 13a approximately agrees with the position of the diffractive optical element 12 and that a rear focus position of its rear lens unit 13b approximately agrees with a position of a predetermined plane 14 indicated by a dashed line in the drawing. In general, a diffractive optical element is constructed by forming level differences with a pitch nearly equal to the wavelength of the exposure light (illumination light) in a substrate, and has an action to diffract an incident beam at desired angles.

Figure 2:
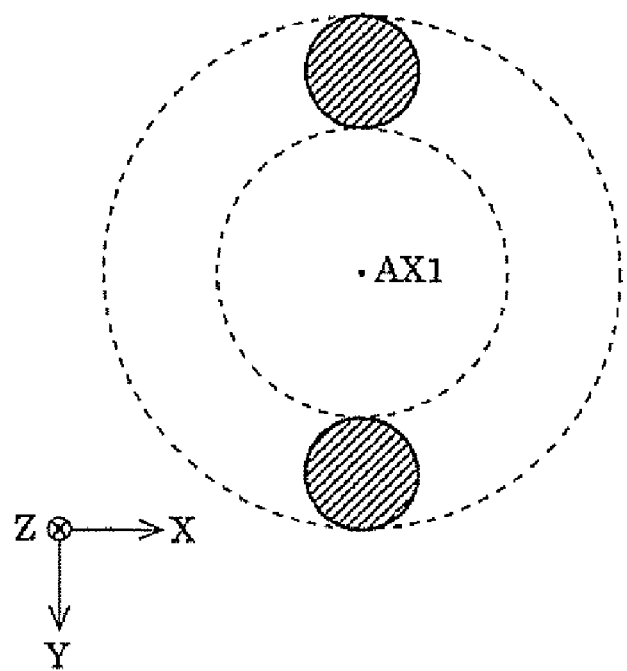
FIG. 2 is a drawing wherein (a) shows a light intensity distribution of a dipolar shape formed on a pupil plane of an afocal lens by first beams and (b) shows a light intensity distribution of a dipolar shape formed on the pupil plane of the afocal lens by second beams.
Figure 2:
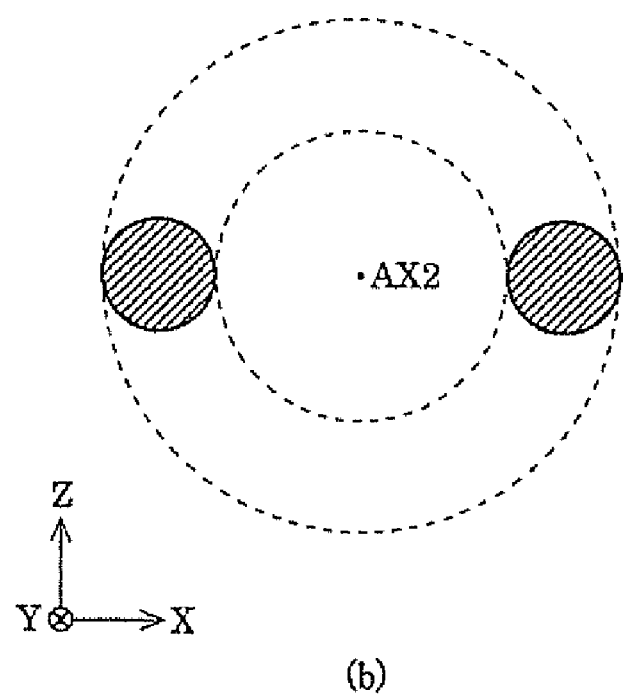

Specifically the diffractive optical element 12 for dipolar illumination has such a function that when a parallel beam with a rectangular cross section is incident thereto, it forms a dipolar light intensity distribution in its far field (or Fraunhofer diffraction region). More specifically, the first beam incident into the diffractive optical element 12 forms a light intensity distribution of two fields spaced in the Y-direction on both sides of the optical axis AX1 of the first optical path, or a light intensity distribution of a Y-directionally dipolar shape on the pupil plane of the afocal lens 13, as shown in FIG. 2 (a), and thereafter beams from the dipolar distribution are emitted from the afocal lens 13. In the optical path between the front lens unit 13a and the rear lens unit 13b, a conical axicon system 15 is located on or near the pupil plane of the afocal lens 13. A configuration and action of the conical axicon system will be described later.

The first beams from the afocal lens 13 travel through a zoom lens (variable-power optical system) 16 for variation in σ value (σ value =mask-side numerical aperture of the illumination system/mask-side numerical aperture of the projection optical system) and are then incident in the X-directionally linearly polarized state into a polarization beam splitter 5. The first beams in the X-directionally linearly polarized state are reflected by the polarization beam splitter 5 and then enter a micro fly's eye lens (or fly's eye lens) 6. The micro fly's eye lens 6 is an optical element consisting of a large number of micro lenses with a positive refracting power arrayed vertically and horizontally and densely. In general, a micro fly's eye lens is constructed, for example, by forming the micro lens group in a plane-parallel plate by etching.

Each micro lens forming the micro fly's eye lens is smaller than each lens element forming the fly's eye lens. The micro fly's eye lens is different from the fly's eye lens consisting of lens elements isolated from each other, in that the large number of micro lenses (microscopic refracting surfaces) are integrally formed without being isolated from each other. However, the micro fly's eye lens is an optical integrator of a wavefront division type as the fly's eye lens is, in that the lens elements with the positive refracting power are arranged vertically and horizontally.

The position of the predetermined plane 14 is set near the front focus position of the zoom lens 16 and the entrance surface of the micro fly's eye lens 6 is located near the rear focus position of the zoom lens 16. In other words, the zoom lens 16 establishes a substantial Fourier transform relation between the predetermined plane 14 and the entrance surface of the micro fly's eye lens 6 and, therefore, it keeps the pupil plane of the afocal lens 13 approximately optically conjugate with the entrance surface of the micro fly's eye lens 6.

Therefore, for example, illumination fields of a dipolar shape on both sides of the optical axis AX are formed on the entrance surface of the micro fly's eye lens 6 as on the pupil plane of the afocal lens 13. The overall shape of the dipolar illumination fields similarly varies depending upon the focal length of the zoom lens 16. Each micro lens forming the micro fly's eye lens 6 has a rectangular cross section similar to a shape of illumination regions IR1, IR2 to be illuminated on the mask M (or a shape of still exposure regions to be formed eventually on the wafer W).

Figure 3:
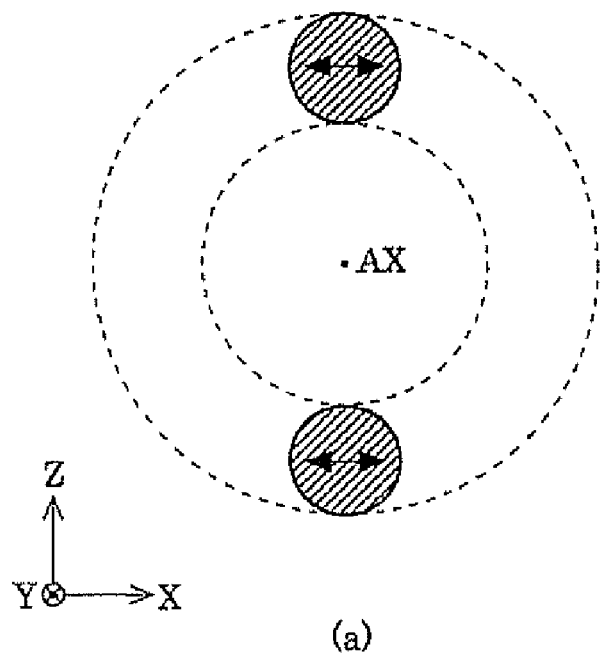
FIG. 3 is a drawing wherein (a) shows a secondary light source of a dipolar shape formed on an illumination pupil by first beams and (b) shows a secondary light source of a dipolar shape formed on the illumination pupil by second beams.
Figure 3:
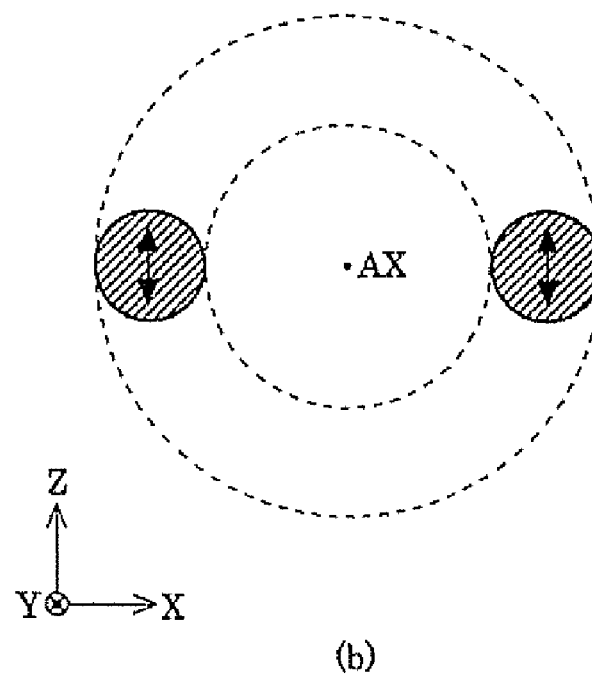

The first beams entering the micro fly's eye lens 6 are two-dimensionally divided by the large number of micro lenses and form a secondary light source with a light intensity distribution approximately identical with the illumination fields formed by the incident beams, i.e., a secondary light source of a Z-directionally dipolar shape consisting of two substantial surface illuminants spaced in the Z-direction on both sides of the optical axis AX, as shown in FIG. 3 (*a*), on a rear focal plane of the micro fly's eye lens 6 or on an illumination pupil near it. The first beams passing through the secondary light source of the Z-directionally dipolar shape are in the X-directionally linearly polarized state, as indicated by double-headed arrows in FIG. 3 (*a*).

On the other hand, the second beam transmitted by the polarization beam splitter 4 and guided along the second optical path is reflected by a path folding mirror PM1 to turn into a linearly polarized state with polarization in the Y-direction (which will be referred to hereinafter as "Y-directionally linearly polarized state"), is then reflected by a path folding mirror PM2 to turn again into the Z-directionally linearly polarized state, and is incident to a shutter member 21. The shutter member 21, afocal lens 23, conical axicon system 25, and zoom lens 26 arranged in the second optical path have the same functions as the shutter member 11, afocal lens 13, conical axicon system 15, and zoom lens 16 in the first optical path.

Specifically, the second beam entering a diffractive optical element 22 for dipolar illumination in the second optical path forms a light intensity distribution of two fields spaced in the X-direction on both sides of the optical axis AX2 of the second optical path, or a light intensity distribution of an X-directionally dipolar shape on the pupil plane of the afocal lens 23, as shown in FIG. 2 (*b*), and beams from the dipolar distribution are emitted from the afocal lens 23. The second beams from the afocal lens 23 travel through the zoom lens 26 for variation in a value and are then incident in the Z-directionally linearly polarized state into the polarization beam splitter 5. The second beams in the Z-directionally linearly polarized state pass through the polarization beam splitter 5 as a path combining member which combines the first optical path and the second optical path, and thereafter the second beams enter the micro fly's eye lens 6.

In this manner, for example, illumination fields of a dipolar shape on both sides of the optical axis AX are formed on the entrance surface of the micro fly's eye lens 6 as on the pupil plane of the afocal lens 23. The overall shape of the dipolar illumination fields similarly varies depending upon the focal length of the zoom lens 26. The second beams entering the micro fly's eye lens 6 are two-dimensionally divided by the large number of micro lenses and form a secondary light source with a light intensity distribution approximately identical with the illumination fields formed by the incident beams, or a secondary light source of an X-directionally dipolar shape consisting of two substantial surface illuminants spaced in the X-direction on both sides of the optical axis AX, as shown in FIG. 3 (*b*), on the rear focal plane of the micro fly's eye lens 6 or on the illumination pupil near it. The second beams passing through the secondary light source of the X-directionally dipolar shape are in the Z-directionally linearly polarized state, as indicated by double-headed arrows in FIG. 3 (*b*).

Figure 4:
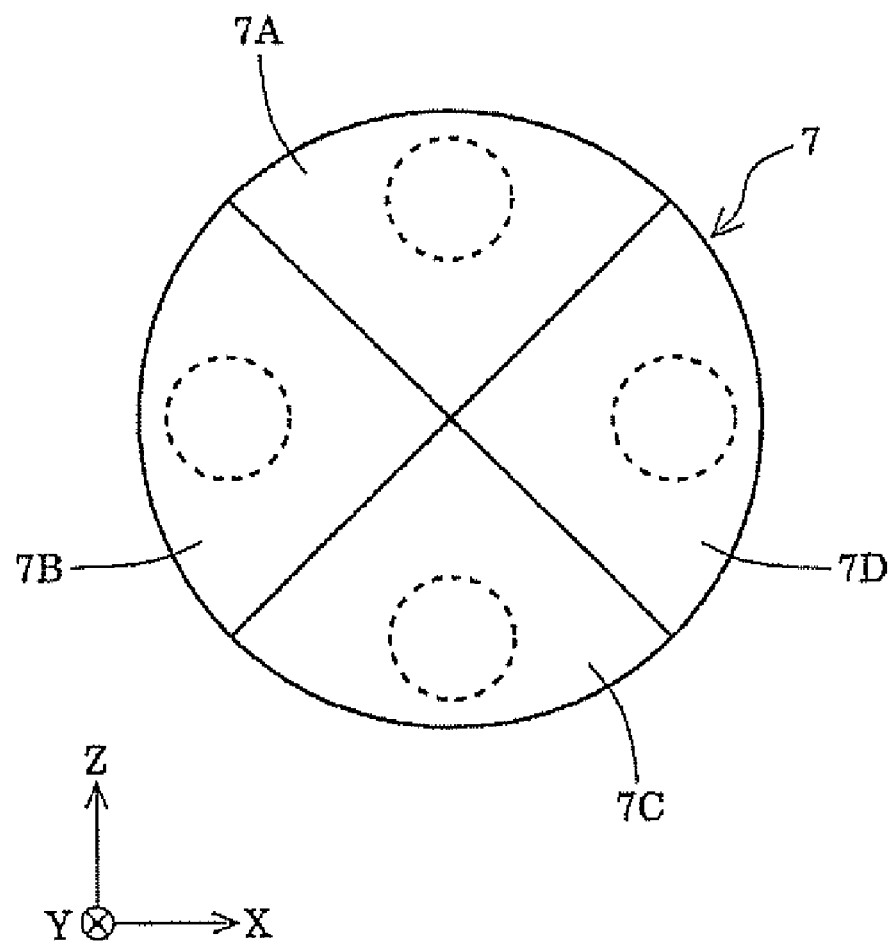
FIG. 4 is a drawing schematically showing a configuration of a deflection unit.

The first beams and the second beams from the micro fly's eye lens 6 travel through a deflection unit 7 arranged near the exit surface of the micro fly's eye lens 6, to enter a condenser optical system 8. The deflection unit 7, as shown in FIG. 4, has a circular effective region centered on the optical axis AX and this circular effective region is composed of four deviation prism members 7A, 7B, 7C, and 7D of a fan shape circumferentially equally divided around the optical axis AX. In these four deviation prism members 7A-7D, each pair of deviation prism members opposed to each other on both sides of the optical axis AX have mutually identical characteristics.

The deviation prism members 7A, 7C are provided in the regions passed by the first beams corresponding to the secondary light source of the Z-directionally dipolar shape formed on the rear focal plane of the micro fly's eye lens 6 or on the illumination pupil near it by the diffractive optical element 12, and have a function to deflect the incident first beams obliquely upward in FIG. 1. On the other hand, the deviation prism members 7B, 7D are provided in the regions passed by the second beams corresponding to the secondary light source of the X-directionally dipolar shape formed on the rear focal plane of the micro fly's eye lens 6 or on the illumination pupil near it by the diffractive optical element 22, and have a function to deflect the incident second beams obliquely downward in FIG. 1.

The first beams deflected obliquely upward in FIG. 1 and the second beams deflected obliquely downward in FIG. 1 through the deflection unit 7 travel through the condenser optical system 8 and each pair of beams superposedly illuminate a mask blind MB. Formed on the mask blind MB as an illumination field stop are illumination fields of a rectangular shape according to the shape of each micro lens element forming the micro fly's eye lens 6. Specifically, the first beams deflected obliquely upward in FIG. 1 by the deflection unit 7 form a first illumination field of a rectangular shape elongated in the X-direction, on the upper side in FIG. 1 of the mask blind MB, and the second beams deflected obliquely downward in FIG. 1 by the deflection unit 7 form a second illumination field of a rectangular shape elongated similarly in the X-direction, on the lower side in FIG. 1 of the mask blind MB.

Figure 5:
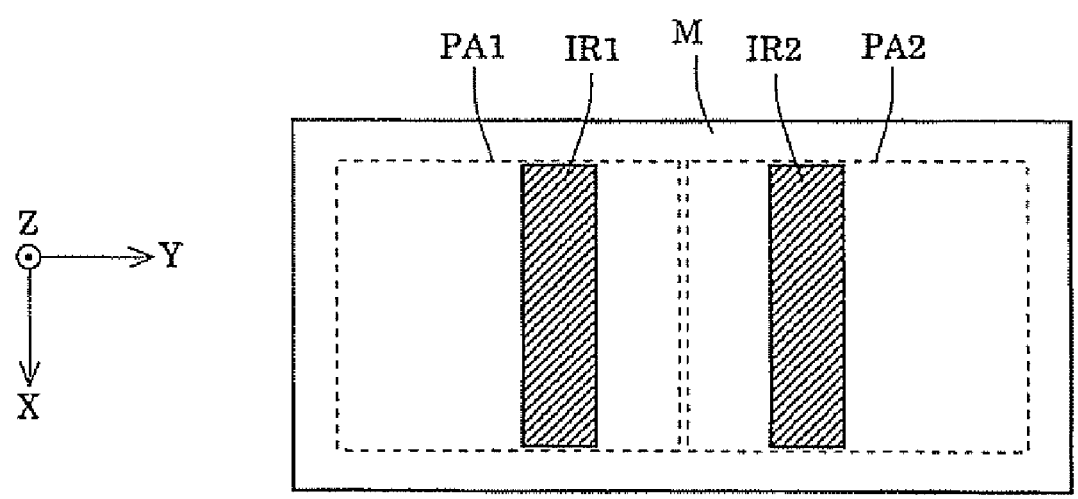
FIG. 5 is a drawing showing a first illumination region formed on a mask and a second illumination region formed on the mask.

The first beams passing through a rectangular aperture (light transmitting portion) of the mask blind MB travel via a front lens unit 9*a* of an imaging optical system 9 (the reference symbol of which is not shown), a path folding mirror PM3, and a rear lens unit 9*b* of the imaging optical system 9 to superposedly illuminate a first illumination region IR1 of a rectangular shape elongated in the X-direction in a first pattern region PA1 on the mask M, as shown in FIG. 5. The first beams, even after reflected by the path folding mirror PM3, reach the mask M while being still in the X-directionally linearly polarized state. Namely, a pattern corresponding to the first illumination region IR1 in the first pattern region PA1 on the mask M is dipolarly illuminated with the light in the X-directionally linearly polarized state.

On the other hand, the second beams passing through the rectangular aperture of the mask blind MB travel via the front lens unit 9*a* of the imaging optical system 9, the path folding mirror PM3, and the rear lens unit 9*b* of the imaging optical system 9 to superposedly illuminate a second illumination region IR2 of a rectangular shape elongated in the X-direction in a second pattern region PA2 on the mask M, as shown in FIG. 5. The second beams are converted from the Z-directionally linearly polarized state into the Y-directionally linearly polarized state through rejection on the path folding mirror PM3 to reach the mask M. Namely, a pattern corresponding to the second illumination region IR2 in the second pattern region PA2 on the mask M is dipolarly illuminated with the light in the Y-directionally linearly polarized state. The first illumination region IR1 and the second illumination region IR2 are symmetric, for example, with respect to an axis passing the optical axis AX and being parallel to the X-direction.

The first beam from the first illumination region IR1 on the mask M held along the XY plane by a mask stage MS, travels through the projection optical system PL to form a pattern image of the first pattern region PA1 on the wafer (photosensitive substrate) W held along the XY plane by a wafer stage WS. The second beam from the second illumination region IR2 on the mask M travels through the projection optical system PL to form a pattern image of the second pattern region PA2 on the wafer W.

In the first embodiment, the first illumination region IR1 is illuminated on the mask M and, while the mask M and the wafer W are synchronously moved along the Y-direction with respect to the projection optical system PL, a scanning exposure of the pattern of the first pattern region PA1 is effected in one shot area on the wafer W. Next, the second illumination region IR2 is illuminated on the mask M and, while the mask M and the wafer W are synchronously moved along the Y-direction with respect to the projection optical system PL, a scanning exposure of the pattern of the second pattern region PA2 is effected in the same shot area on the wafer W in a state in which the pattern of the second pattern region PA2 is superimposed over the pattern of the first pattern region PA1. By two-dimensionally stepping the wafer W along the XY plane with respect to the projection optical system PL and repeating the above-described two scanning exposures or double exposures, the synthetic pattern of the pattern of the first pattern region PA1 and the pattern of the second pattern region PA2 is sequentially formed in each of shot areas on the wafer W.

The conical axicon system 15, 25 is composed of the following members arranged in order from the light source side (light entrance side): first prism member 15a, 25a with a plane on the light source side and with a refracting surface of a concave conical shape on the mask side (light exit side); and second prism member 15b, 25b with a plane on the mask side and with a refracting surface of a convex conical shape on the light source side. The concave conical refracting surface of the first prism member 15a, 25a and the convex conical refracting surface of the second prism member 15b, 25b are complementarily formed so as to be able to butt each other. At least one of the first prism member 15a, 25a and the second prism member 15b, 25b is arranged as movable along the optical axis AX1, AX2, whereby the spacing is variable between the concave conical refracting surface of the first prism member 15a, 25a and the convex conical refracting surface of the second prism member 15b, 25b.

In a state in which the concave conical refracting surface of the first prism member 15a, 25a and the convex conical refracting surface of the second prism member 15b, 25b butt each other, the conical axicon system 15, 25 functions as a plane-parallel plate and causes no effect on the secondary light source of the dipolar shape formed. However, as the concave conical refracting surface of the first prism member 15a, 25a is separated from the convex conical refracting surface of the second prism member 15b, 25b, the outside diameter (inside diameter) of the dipolar secondary light source varies while keeping the width of the dipolar secondary light source (half of a difference between a diameter (outside diameter) of a circle circumscribed on the dipolar secondary light source and a diameter (inside diameter) of a circle inscribed in the secondary light source) constant. Namely, the separation results in changing the annular ratio (inside diameter/outside diameter) and size (outside diameter) of the dipolar secondary light source.

The zoom lens 16, 26 has a function to similarly (isotropically) enlarge or reduce the overall shape of the secondary light source. For example, when the focal length of the zoom lens 16, 26 is increased from a minimum value to a predetermined value, the overall shape of the secondary light source is similarly enlarged. In other words, the width and size (outside diameter) of the secondary light source both vary, without variation in the annular ratio of the dipolar secondary light source, by the action of the zoom lens 16, 26. In this way, the annular ratio and size (outside diameter) of the dipolar secondary light source can be controlled by the actions of the conical axicon system 15, 25 and the zoom lens 16, 26.

It is also possible to set a V-groove axicon system (not shown) or a pyramid axicon system (not shown), instead of the conical axicon system 15, 25, on or near the pupil plane of the afocal lens 13, 23. The V-groove axicon system has refracting surfaces of a V-shaped sectional shape approximately symmetric with respect to a predetermined axis passing the optical axis, and the pyramid axicon system has refracting surfaces of a shape corresponding to side faces of a pyramid centered on the optical axis. Concerning the configurations and actions of the V-groove axicon system and the pyramid axicon system, reference can be made, for example, to Japanese Patent Application Laid-open No. 2002-231619 and U.S. Pat. Published Application No. 2004/263817 corresponding thereto, The teachings of U.S. Pat. Published Application No. 2004/263817 are incorporated herein by reference.

In the first embodiment, the polarization state of the beam incident to the polarization beam splitter 4 is switched between s-polarized light and p-polarized light for the polarization separation surface of the polarization beam splitter 4, i.e., between the X-directionally linearly polarized state and the Z-directionally linearly polarized state, by the action of the half wave plate 3 rotatable around the optical axis AX. Specifically, when the scanning exposure of the pattern of the first pattern region PA1 is effected, the half wave plate 3 as a polarization state switching member is so set that the s-polarized light is incident to the polarization beam splitter 4 by the action thereof. As a result, all the light incident through the half wave plate 3 into the polarization beam splitter 4 is reflected by the polarization separation surface thereof to be guided into the first optical path.

The beam reflected by the polarization beam splitter 4 and guided into the first optical path forms the secondary light source in the Z-directionally dipolar shape and in the X-directionally linearly polarized state on the rear focal plane of the micro fly's eye lens 6 or on the illumination pupil near it, and then the beams therefrom dipolarly illuminate the first illumination region IR1 while being in the X-directionally linearly polarized state. It is preferable to shut out unwanted light entering the second optical path, by the shutter member 21, in order to prevent the unwanted light entering the second optical path depending upon a manufacturing error or the like of the polarization beam splitter 4, from reaching the mask M. Alternatively, the unwanted light entering the second optical path can also be shut out by the mask blind MB.

Next, for effecting the scanning exposure of the pattern of the second pattern region PA2, the half wave plate 3 is rotated by a predetermined angle around the optical axis AX so that the p-polarized light can enter the polarization beam splitter 4. As a result, all the light incident through the half wave plate 3 into the polarization beam splitter 4 passes through the polarization separation surface thereof to be guided into the second optical path. The beam transmitted by the polarization beam splitter 4 and guided into the second optical path forms the secondary light source in the X-directionally dipolar shape and in the Z-directionally linearly polarized state on the rear focal plane of the micro fly's eye lens 6 or on the illumination pupil near it, and then the beams therefrom dipolarly illuminate the second illumination region IR2 while being in the Y-directionally linearly polarized state. It is preferable to shut out unwanted light entering the first optical path, by the shutter member 11, in order to prevent the unwanted light entering the first optical path depending upon a manufacturing error or the like of the polarization beam splitter 4, from reaching the mask M. Alternatively, the unwanted light entering the first optical path can also be shut out by the mask blind MB.

In the first embodiment, as described above, the polarization beam splitter 4, and the half wave plate 3 as the polarization state switching member that switches the polarization state of the beam incident to the polarization beam splitter 4 between the two linearly polarization states (the X-directionally linearly polarized state and the Z-directionally linearly polarized state in the above example) constitute a path switching member that switches the optical path of the exiting beam between the first optical path and the second optical path. Therefore, the illumination can be switched between the dipolar illumination of the first illumination region IR1 in the X-directionally linearly polarized state and the dipolar illumination of the second illumination region IR2 in the Y-directionally linearly polarized state, by simply performing the simple operation of rotating the half wave plate 3 as the polarization state switching member by the required angle around the optical axis AX.

Namely, the illumination optical apparatus of the first embodiment is able to sequentially and individually illuminate the first pattern region PA1 and the second pattern region PA2 on the mask M under the required illumination conditions with the shape or size of the light intensity distribution on the illumination pupil, the polarization state of the illumination light, or the like as a parameter, and, therefore, to quickly perform the switching of the illumination conditions between the illumination in the first pattern region PA1 and the illumination in the second pattern region PA2. As a consequence, the exposure apparatus of the present embodiment is able to perform the exposure of the fine pattern of the mask M on the wafer W with high accuracy and high throughput by the double exposure method, using the illumination optical apparatus quickly performing the switching of the illumination conditions between the illumination in the first pattern region PA1 and the illumination in the second pattern region PA2.

In general, the exposure apparatus is preferably arranged to illuminate the pattern on the mask M with light in a required linearly polarized state so that the light impinging on the wafer W is in a polarized state in which the s-polarized light is a principal component. The s-polarized light herein is linearly polarized light with the polarization direction along a direction normal to a plane of incidence (polarized light with the electric vector vibrating in the direction normal to the plane of incidence). The plane of incidence is defined as a plane including a point where light reaches a boundary surface of a medium (the surface of the wafer W) and including a normal to the boundary surface at that point and a direction of incidence of light. When the mask pattern is illuminated with the light in the required linearly polarized state so that the light impinging on the wafer W is in the polarized state with the principal component of s-polarized light as described above, an improvement is made in optical performance (depth of focus and others) of the projection optical system PL and a high-contrast pattern image is obtained on the wafer W.

In the first embodiment, the scanning exposure of the pattern of the first pattern region PA1 is effected while the pattern corresponding to the first illumination region IR1 is illuminated with the light from the secondary light source in the Z-directionally dipolar shape and in the X-directionally linearly polarized state as shown in FIG. 3 (a). As a result, the light focused on the wafer W as a final illumination target surface from the X-directional pattern elongated along the X-direction in the pattern of the first pattern region PA1 illuminated with the light in the first illumination region IR1, is in the polarized state with the principal component of s-polarized light, whereby a high-contrast pattern image is obtained on the wafer W.

Similarly, the scanning exposure of the pattern of the second pattern region PA2 is effected while the pattern corresponding to the second illumination region IR2 is illuminated with the light from the secondary light source in the X-directionally dipolar shape and in the Y-directionally linearly polarized state as shown in FIG. 3 (b). As a result, the light focused on the wafer W as the final illumination target surface from the Y-directional pattern elongated along the Y-direction in the pattern of the second pattern region PA2 illuminated with the light in the second illumination region IR2, is in the polarized state with the principal component of s-polarized light, whereby a high-contrast pattern image is obtained on the wafer W.

In the first embodiment, the first beams are deflected obliquely upward in FIG. 1 and guided to the first illumination region IR1, and the second beams are deflected obliquely downward in FIG. 1 and guided to the second illumination region IR2 separated from the first illumination region IR1, by the action of the deflection unit 7. However, without having to be limited to this, it is also possible to adopt a configuration without installation of the deflection unit 7, for example, in which the first illumination region centered on the optical axis AX is illuminated with the first beams and in which the second illumination region located at the same position as the first illumination region with respect to the optical axis AX is illuminated with the second beams. However, the first beams illuminate the first pattern region PA1 and the second beams the second pattern region PA2.

Figure 6:
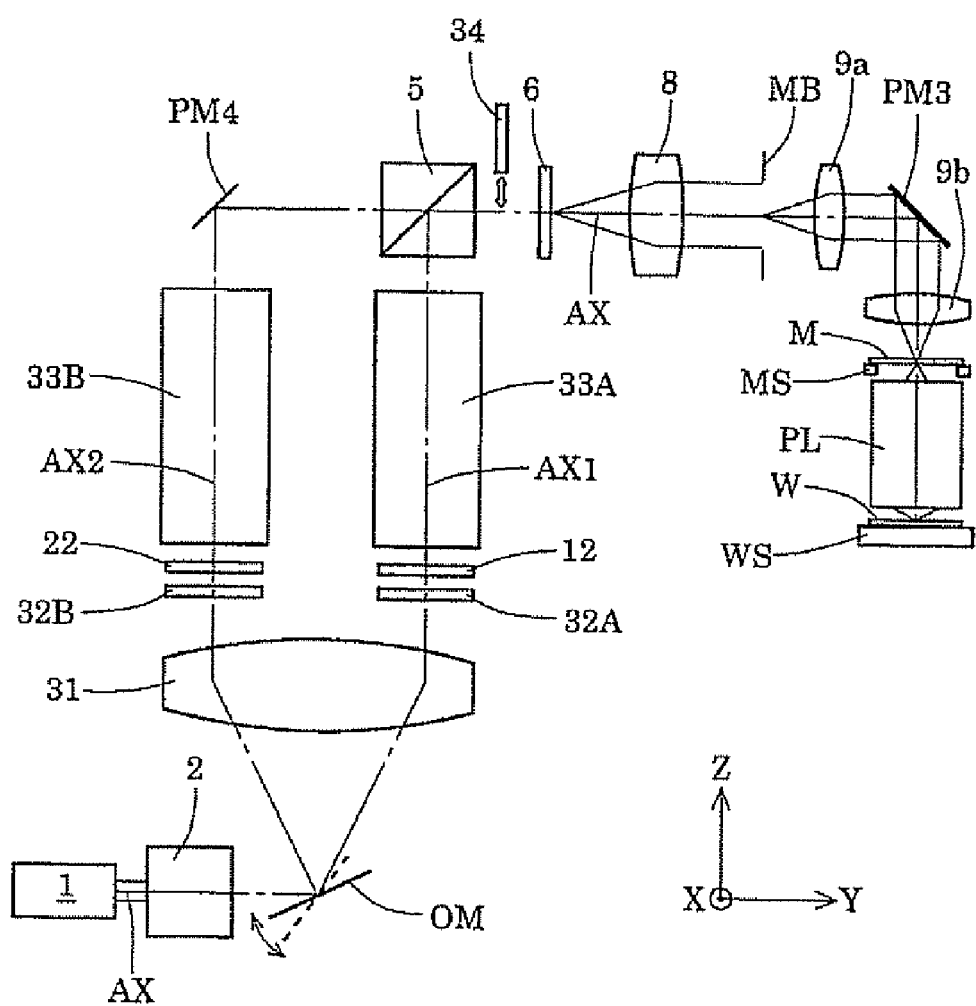
FIG. 6 is a drawing schematically showing a configuration of an exposure apparatus according to a second embodiment of the present invention.

FIG. 6 is a drawing schematically showing a configuration of an exposure apparatus according to the second embodiment of the present invention. The second embodiment has the configuration similar to that of the first embodiment but is different in the configuration between the shaping optical system 2 and the pair of diffractive optical elements 12, 22 and in the presence/absence of installation of the deflection unit 7 from the first embodiment. In FIG. 6, the elements with the same functionality as the components in the first embodiment shown in FIG. 1 are denoted by the same reference symbols as those in FIG. 1. The configuration and action of the second embodiment will be described below with focus on the differences from the first embodiment.

In the second embodiment, the beam emitted along the optical axis AX from the light source 1 is expanded into a beam of a required sectional shape by the shaping optical system 2 and then the expanded beam enters a changeover mirror OM. The changeover mirror OM is actuated, for example, by a piezoelectric device or the like so that it can be switched between a first posture (posture indicated by a solid line in FIG. 6) in which it reflects the incident beam from the shaping optical system 2 toward the first optical path and a second posture (posture indicated by a dashed line in FIG. 6) in which it reflects the incident beam toward the second optical path, The first beam reflected by the changeover mirror OM set in the first posture and guided into the first optical path travels through a common optical system 31 common to the first optical path and the second optical path, and through a half wave plate 32A arranged as rotatable around the optical axis AX1 of the first optical path, to enter the diffractive optical element 12.

The half wave plate 32A is a polarization changing member which is arranged in the first optical path and which changes the polarization state of the beam, and it converts linearly polarized light incident from the shaping optical system 2, into s-polarized light for the polarization separation surface of the polarization beam splitter 5 in a subsequent stage, i.e., into X-directionally linearly polarized light and guides the resulting light to the diffractive optical element 12. The first beams from the diffractive optical element 12 travel through a core optical system 33A and then enter the polarization beam splitter 5 while being still in the X-directionally linearly polarized state. The first beams in the X-directionally linearly polarized state reflected by the polarization beam splitter 5 are then incident into the micro fly's eye lens 6. The core optical system 33A is an optical system including the afocal lens 13, conical axicon system 15, and zoom lens 16 shown in FIG. 1. Therefore, the first beams entering the micro fly's eye lens 6 form the secondary light source in the Z-directionally dipolar shape and in the X-directionally linearly polarized state as shown in FIG. 3 (a), on the rear focal plane of the micro fly's eye lens 6 or on the illumination pupil near it.

On the other hand, the second beam reflected by the changeover mirror OM set in the second posture and guided into the second optical path travels through the common optical system 31 and a half wave plate 32B arranged as rotatable around the optical axis AX2 of the second optical path, to enter the diffractive optical element 22. The half wave plate 32B is a polarization changing member which is arranged in the second optical path and which changes the polarization state of the beam, and it converts the linearly polarized light incident thereinto from the shaping optical system 2, into p-polarized light for the polarization separation surface of the polarization beam splitter 5, i.e., into Y-directionally linearly polarized light and guides the resulting light to the diffractive optical element 22.

The second beams from the diffractive optical element 22 travel through a core optical system 33B and are then reflected by a path folding mirror PM4 to turn into the Z-directionally linearly polarized state, and then the second beams enter the polarization beam splitter 5. The second beams in the Z-directionally linearly polarized state transmitted by the polarization beam splitter 5 are then incident into the micro fly's eye lens 6. The core optical system 33B is an optical system including the afocal lens 23, conical axicon system 25, and zoom lens 26 shown in FIG. 1. Therefore, the second beams incident into the micro fly's eye lens 6 form the secondary light source in the X-directionally dipolar shape and in the Z-directionally linearly polarized state as shown in FIG. 3 (b), on the rear focal plane of the micro fly's eye lens 6 or on the illumination pupil near it.

The first beams from the secondary light source of the Z-directionally dipolar shape travel via the condenser optical system 8, mask blind MB, and imaging optical system 9 to superposedly illuminate the first illumination region (not shown) of a rectangular shape elongated in the X-direction in the first pattern region PA1 on the mask M. Namely, a pattern corresponding to the first illumination region in the first pattern region PA1 on the mask M is dipolarly illuminated with the light in the X-directionally linearly polarized state. On the other hand, the second beams from the secondary light source of the X-directionally dipolar shape travel via the condenser optical system 8, mask blind MB, and imaging optical system 9 to superposedly illuminate the second illumination region (not shown) of a rectangular shape elongated in the X-direction in the second pattern region PA2 on the mask M. Namely, a pattern corresponding to the second illumination region in the second pattern region PA2 on the mask M is dipolarly illuminated with the light in the Y-directionally linearly polarized state.

Since the second embodiment is arranged without installation of the deflection unit 7, for example, the first beams illuminate the first illumination region centered on the optical axis AX and the second beams illuminate the second illumination region at the same position as the first illumination region with respect to the optical axis AX. However, the Y-directional position of the mask M is different during the illumination in the first illumination region with the first beams from that during the illumination in the second illumination region with the second beams; therefore, the first beams illuminate the first pattern region PA1 and the second beams the second pattern region PA2. The deflection unit 7 can also be installed in the second embodiment as in the first embodiment. In this case, just as in the case of the first embodiment, the first beams illuminate the first illumination region IR1 and the second beams illuminate the second illumination region IR2 located at the position different from that of the first illumination region IR1.

In the second embodiment, the illumination can be changed over between the dipolar illumination of the first pattern region PA1 in the X-directionally linearly polarized state and the dipolar illumination of the second pattern region PA2 in the Y-directionally linearly polarized state, by simply performing the simple operation of switching the posture of the changeover mirror OM between the first posture to reflect the incident beam toward the first optical path and the second posture to reflect the incident beam toward the second optical path. Namely, the second embodiment is also able to sequentially and individually illuminate the first pattern region PA1 and the second pattern region PA2 on the mask M, under the required illumination conditions with the shape or size of the light intensity distribution on the illumination pupil, the polarization state of the illumination light, or the like as a parameter and, therefore, to quickly perform the switching of the illumination conditions between the illumination in the first pattern region PA1 and the illumination in the second pattern region PA2.

In the second embodiment, the half wave plate 32A as a polarization changing member is arranged in the first optical path and the half wave plate 32B as a polarization changing member is arranged in the second optical path. However, the exposure apparatus can be constructed without installation of the half wave plate 32B, for example, by adopting such a setting that the s-polarized light for the polarization separation surface of the polarization beam splitter 5 is incident into the common optical system 31. Similarly, the exposure apparatus can be constructed without installation of the half wave plate 32A, by adopting such a setting that the p-polarized light for the polarization separation surface of the polarization beam splitter 5 is incident into the common optical system 31.

In the second embodiment, a depolarizer (depolarization element) 34 can be provided in a retractable state, for example, in the optical path between the polarization beam splitter 5 as a path combining member and the micro fly's eye lens 6. In this case, the depolarizer 34 is set in the illumination optical path, for example, during the scanning exposure of the pattern in the first pattern region PA1 to illuminate the first pattern region PA1 with light in an unpolarized state, whereby, for example, an image of a supplementary pattern with a relatively large line width can be formed well on the wafer W. In the second embodiment, the mirror OM can be, for example, a DMD (Digital Micromirror Device) including a plurality of reflecting elements driven based on predetermined electronic data.

Figure 7:
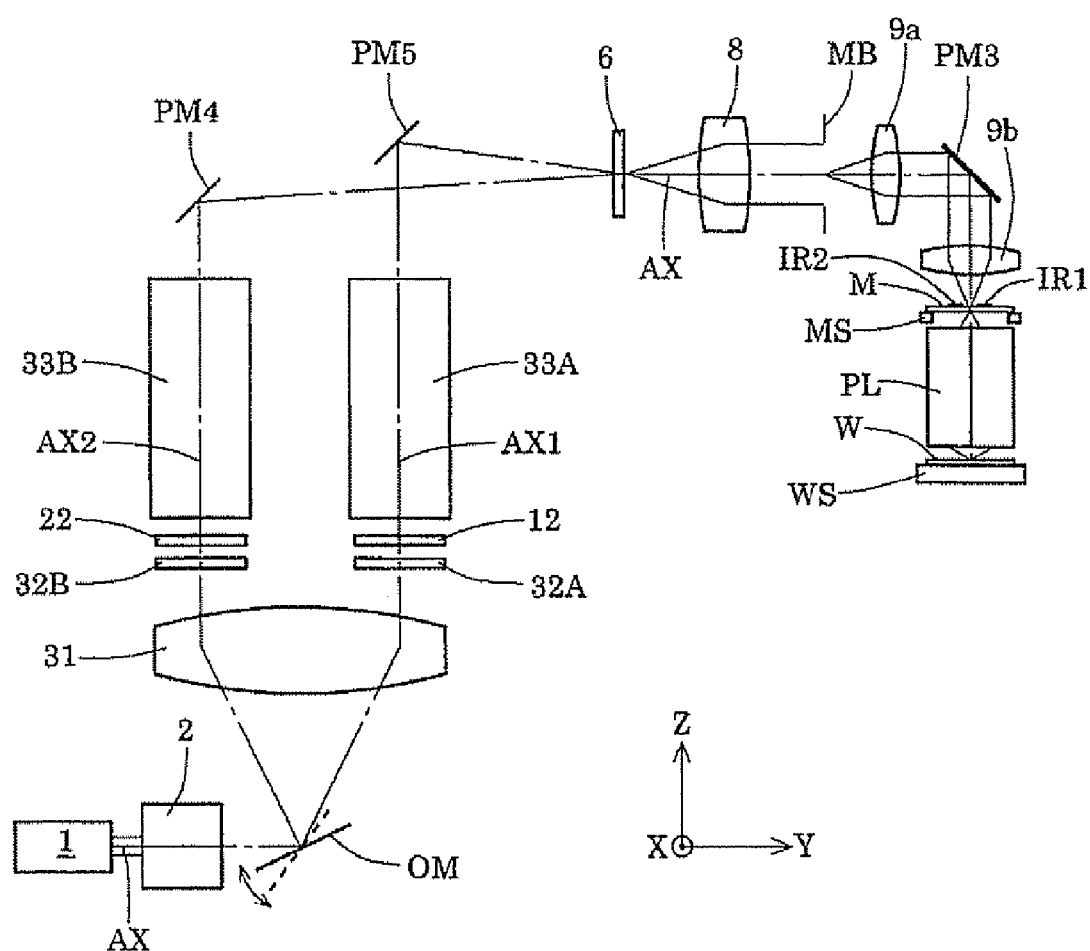
FIG. 7 is a drawing schematically showing a configuration of an exposure apparatus according to a third embodiment of the present invention.

FIG. 7 is a drawing schematically showing a configuration of an exposure apparatus according to the third embodiment of the present invention. The third embodiment has the configuration similar to that of the second embodiment, but is basically different from the second embodiment in that a path folding mirror PM5 is used instead of the polarization beam splitter 5. In FIG. 7, the elements with the same functionality as the components in the second embodiment in FIG. 6 are denoted by the same reference symbols as those in FIG. 6. The configuration and action of the third embodiment will be described below with focus on the differences from the second embodiment.

In the third embodiment, the first beams from the diffractive optical element 12 travel through the core optical system 33A and are then reflected by the path folding mirror PM5 to enter the micro fly's eye lens 6. The first beams entering the micro fly's eye lens 6 form the secondary light source in the Z-directionally dipolar shape and in the X-directionally linearly polarized state as shown in FIG. 3 (a), on the rear focal plane of the micro fly's eye lens 6 or on the illumination pupil near it. The second beams from the diffractive optical element 22 travel through the core optical system 33B, are then reflected by the path folding mirror PM4 to turn into the Z-directionally linearly polarized state, and thereafter are incident into the micro fly's eye lens 6. The second beams incident into the micro fly's eye lens 6 form the secondary light source in the X-directionally dipolar shape and in the Z-directionally linearly polarized state as shown in FIG. 3 (b), on the rear focal plane of the micro fly's eye lens 6 or on the illumination pupil near it.

The first beams from the secondary light source of the Z-directionally dipolar shape travel via the condenser optical system 8, mask blind MB, and imaging optical system 9 to superposedly illuminate the first illumination region IR1 of the rectangular shape elongated in the X-direction in the first pattern region PA1 on the mask M. Namely, a pattern corresponding to the first illumination region IR1 in the first pattern region PA1 on the mask M is dipolarly illuminated with the light in the X-directionally linearly polarized state. On the other hand, the second beams from the secondary light source of the X-directionally dipolar shape travel via the condenser optical system 8, mask blind MB, and imaging optical system 9 to superposedly illuminate the second illumination region IR2 of the rectangular shape elongated in the X-direction in the second pattern region PA2 on the mask M. Namely, a pattern corresponding to the second illumination region IR2 in the second pattern region PA2 on the mask M is dipolarly illuminated with the light in the Y-directionally linearly polarized state. The first illumination region IR1 and the second illumination region IR2 are symmetric, for example, with respect to an axis passing the optical axis AX and being parallel to the X-direction.

In the third embodiment, as described above, the path folding mirror PM5 to reflect the beams incident along the first optical path, and the path folding mirror PM4 to reflect the beams incident along the second optical path, constitute a path combining member combining the first optical path and the second optical path. In the third embodiment the path folding mirrors PM4, PM5 may be replaced, for example, with an oscillating mirror driven by a piezoelectric element. In this case, influence of interference fringes in formation of pattern on the wafer W can be reduced by the action of the oscillating mirror.

Figure 8:
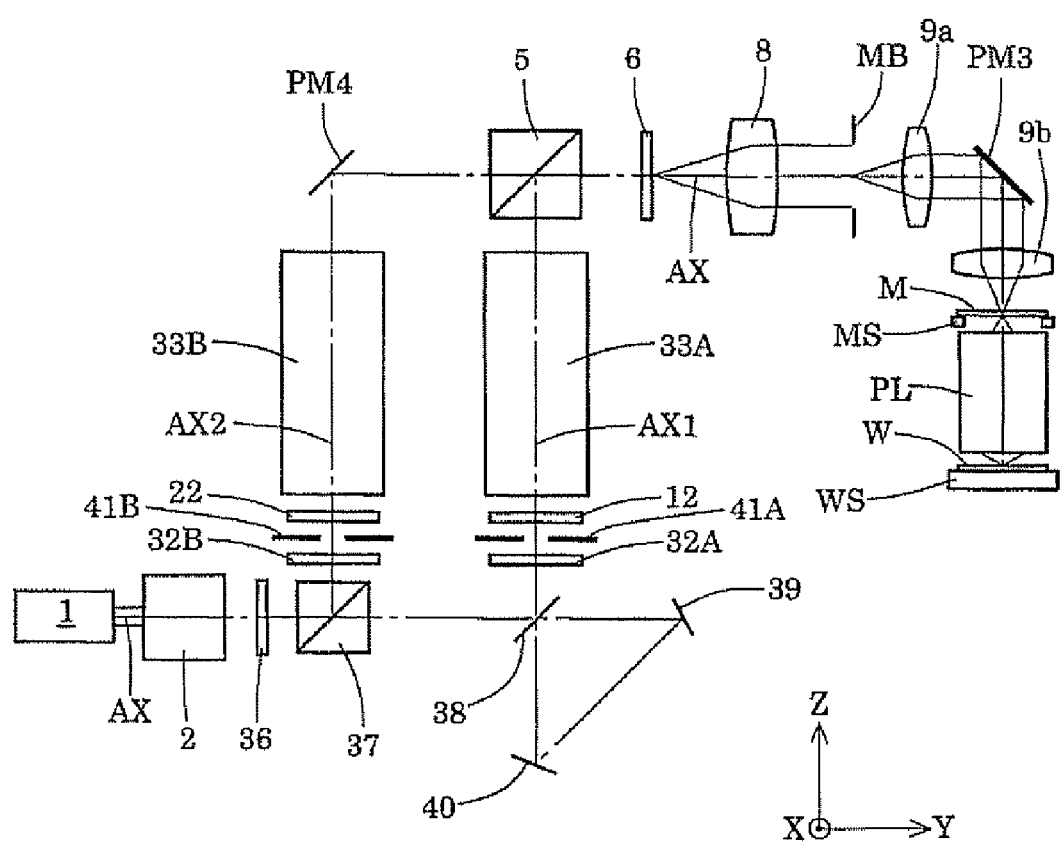
FIG. 8 is a drawing schematically showing a configuration of an exposure apparatus according to a fourth embodiment of the present invention.

FIG. 8 is a drawing schematically showing a configuration of an exposure apparatus according to the fourth embodiment of the present invention. The fourth embodiment has the configuration similar to that of the second embodiment but is basically different in the configuration between the shaping optical system 2 and the pair of half wave plates 32A, 32B from the second embodiment. In FIG. 8, the elements with the same functionality as the components in the second embodiment of FIG. 6 are denoted by the same reference symbols as those in FIG. 6. The configuration and action of the fourth embodiment will be described below with focus on the differences from the second embodiment.

In the fourth embodiment, the beam emitted along the optical axis AX from the light source 1 is expanded into a beam of a required sectional shape by the shaping optical system 2 and then travels through a quarter wave plate 36 to enter a polarization beam splitter 37. The quarter wave plate 36 converts incident linearly polarized light info circularly polarized light and guides the resulting light to the polarization beam splitter 37. Therefore, of the circularly polarized light entering the polarization beam splitter 37, the light transmitted by the polarization beam splitter 37 is guided into the first optical path and the light reflected by the polarization beam splitter 37 is guided into the second optical path. Namely, the polarization beam splitter 37 constitutes a beam separating member which separates the incident beam into the first beam traveling along the first optical path and the second beam traveling along the second optical path.

The first beam in the p-polarized state or Z-directionally linearly polarized state transmitted by the polarization beam splitter 37 travels through a polarization beam splitter 38, is successively reflected by reflecting mirrors 39, 40, and thereafter is incident again into the polarization beam splitter 38. In this way, the polarization beam splitter 38 and the pair of reflecting mirrors 39, 40 constitute an optical delay path (retarder). The first beam turning into the Y-directionally linearly polarized state through the optical delay path travels through the polarization beam splitter 38 and then passes through the half wave plate 32A to turn into the X-directionally linearly polarized state and enter the diffractive optical element 12. The first beams from the diffractive optical element 12 form the secondary light source in the Z-directionally dipolar shape and in the X-directionally linearly polarized state as shown in FIG. 3 (a), on the rear focal plane of the micro fly's eye lens 6 or on the illumination pupil near it.

The second beam in the s-polarized state or X-directionally linearly polarized state reflected by the polarization beam splitter 37 travels through the half wave plate 32B to turn into the Y-directionally linearly polarized state and enter the diffractive optical element 22. The second beams from the diffractive optical element 22 form the secondary light source in the Z-directionally linearly polarized state as shown in FIG. 3 (b), on the rear focal plane of the micro fly's eye lens 6 or on the illumination pupil near it. A first shutter member 41A which shuts out the first beam as occasion demands is provided in the optical path between the half wave plate 32A and the diffractive optical element 12 and a second shutter member 41B which shuts out the second beam as occasion demands is provided in the optical path between the half wave plate 32B and the diffractive optical element 22. The actions of the shutter members 41A, 41B will be described later.

The first beams from the secondary light source of the Z-directionally dipolar shape superposedly illuminate the first illumination region (not shown) of the rectangular shape elongated in the X-direction in the first pattern region PA1 on the mask M. Namely, for example, a pattern corresponding to the first illumination region centered on the optical axis AX in the first pattern region PA1 on the mask M is dipolarly illuminated with the light in the X-directionally linearly polarized state. On the other hand, the second beams from the secondary light source of the X-directionally dipolar shape superposedly illuminate the second illumination region (not shown) of the rectangular shape elongated in the X-direction in the second pattern region PA2 on the mask M. Namely, for example, a pattern corresponding to the second illumination region centered on the optical axis AX in the second pattern region PA2 on the mask M is dipolarly illuminated with the light in the Y-directionally linearly polarized state.

In the fourth embodiment, the scanning exposure of the pattern in the first pattern region PA1 is carried out in such a manner that the second shutter member 41B is closed to block entrance of the second beam to the diffractive optical element 22 and that the first shutter member 41A is opened to permit entrance of the first beam to the diffractive optical element 12. On the other hand, the scanning exposure of the pattern in the second pattern region PA2 is carried out in such a manner that the first shutter member 41A is closed to block entrance of the first beam to the diffractive optical element 12 and that the second shutter member 41B is opened to permit entrance of the second beam to the diffractive optical element 22. In other words, the exposure apparatus is able to perform switching between the dipolar illumination of the first pattern region PA1 in the X-directionally linearly polarized state and the dipolar illumination of the second pattern region PA2 in the Y-directionally linearly polarized state, by simply performing the simple operation of opening and closing the shutter members 41A, 41B.

In the fourth embodiment, when the shutter members 41A, 41B both are opened, for example, an illumination region centered on the optical axis AX on the mask M can be illuminated with light in the circumferentially linearly polarized state from a secondary light source of a quadrupolar shape consisting of a combination of the secondary light source of the Z-directionally dipolar shape shown in FIG. 3 (a) and the secondary light source of the X-directionally dipolar shape shown in FIG. 3 (b). At this time, only the p-polarized light transmitted by the polarization beam splitter 37 is retarded through the retarder 38-40 out of the p-polarized light and the s-polarized light separated by the polarization beam splitter 37. As a result, temporal coherency is reduced between the p-polarization component and the s-polarization component to be combined in the subsequent polarization beam splitter 5 so that a pattern can be formed well on the wafer W through the projection optical system PL.

Figure 9:
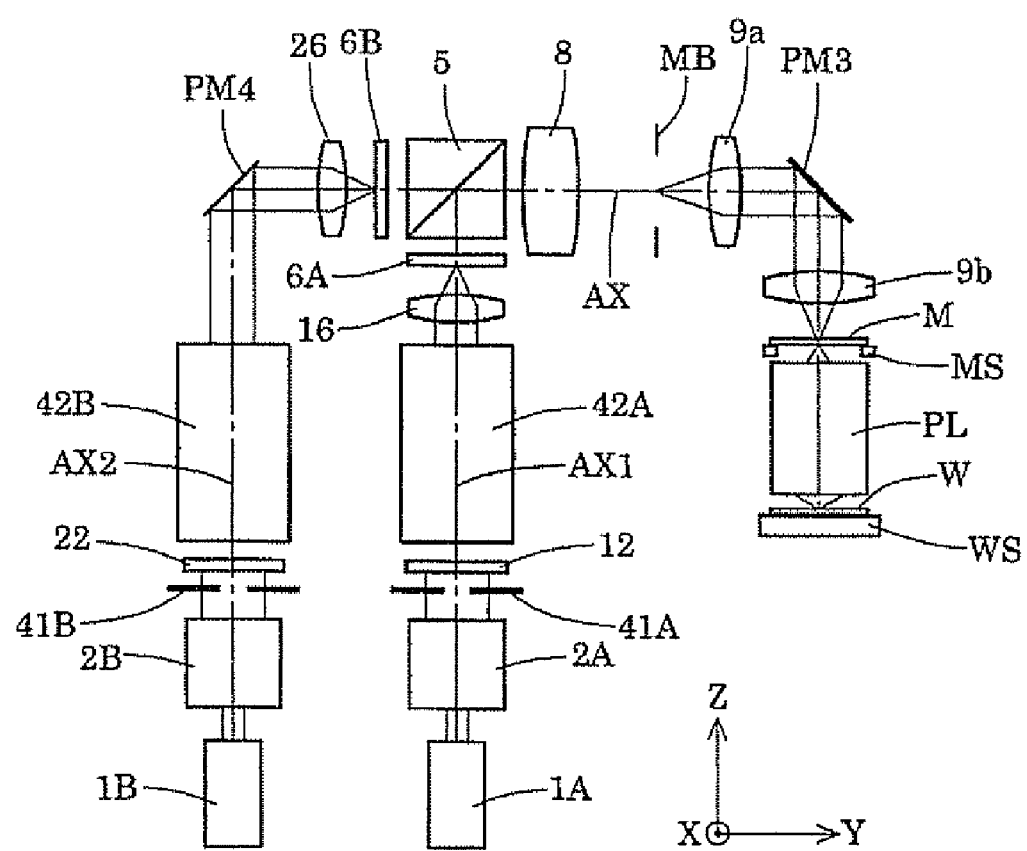
FIG. 9 is a drawing schematically showing a configuration of an exposure apparatus according to a fifth embodiment of the present invention.

FIG. 9 is a drawing schematically showing a configuration of an exposure apparatus according to the fifth embodiment of the present invention. The fifth embodiment has the configuration similar to that of the fourth embodiment but is basically different from the fourth embodiment in that the light source, shaping optical system, and micro fly's eye lens are arranged in each of the first optical path and the second optical path. In FIG. 9, the elements with the same functionality as the components in the fourth embodiment of FIG. 8 are denoted by the same reference symbols as those in FIG. 8. The configuration and action of the fifth embodiment will be described below with focus on the differences from the fourth embodiment.

In the fifth embodiment, a first beam in the s-polarized state or X-directionally linearly polarized state emitted from a first light source 1A travels through a first shaping optical system 2A to enter the diffractive optical element 12. The first beams from the diffractive optical element 12 travel through core optical system 42A and zoom lens 16 to enter a first micro fly's eye lens 6A. The core optical system 42A is an optical system including the afocal lens 13 and conical axicon system 15 shown in FIG. 1. Therefore, the first beams entering the first micro fly's eye lens 6A form a secondary light source in the Y-directionally dipolar shape and in the X-directionally linearly polarized state, corresponding to the secondary light source shown in FIG. 3 (a), on the rear focal plane of the first micro fly's eye lens 6A or on the illumination pupil near it. The first beams from the secondary light source of the Y-directionally dipolar shape are reflected by the polarization beam splitter 5 as a path combining member and thereafter superposedly illuminate the first illumination region (not shown) of the rectangular shape elongated in the X-direction in the first pattern region PA1 on the mask M. Namely, for example, a pattern corresponding to the first illumination region centered on the optical axis AX in the first pattern region PA1 on the mask M is dipolarly illuminated with the light in the X-directionally linearly polarized state.

On the other hand, a second beam in the p-polarized state or Y-directionally linearly polarized state emitted from a second light source 1B travels through second shaping optical system 2B to enter the diffractive optical element 22. The second beams from the diffractive optical element 22 travel through core optical system 42B, reflecting mirror PM4, and zoom lens 26 and are then incident in the Z-directionally linearly polarized state to a second micro fly's eye lens 6B. The core optical system 42B is an optical system including the afocal lens 23 and conical axicon system 25 shown in FIG. 1. Therefore, the second beams entering the second micro fly's eye lens 6B form a secondary light source in the X-directionally dipolar shape and in the Z-directionally linearly polarized state as shown in FIG. 3 (b), on the rear focal plane of the second micro fly's eye lens 6B or on the illumination pupil near it. The second beams from the secondary light source of the X-directionally dipolar shape travel through the polarization beam splitter 5 and thereafter superposedly illuminate the second illumination region (not shown) of the rectangular shape elongated in the X-direction in the second pattern region PA2 on the mask M. Namely, for example, a pattern corresponding to the second illumination region centered on the optical axis AX in the second pattern region PA2 on the mask M is dipolarly illuminated with the light in the Y-directionally linearly polarized state.

In the fifth embodiment, similarly as in the fourth embodiment, the scanning exposure of the pattern in the first pattern region PA1 is carried out in such a manner that the second shutter member 41B is closed and that the first shutter member 41A is opened. Furthermore, the scanning exposure of the pattern in the second pattern region PA2 is carried out in such a manner that the first shutter member 41A is closed and that the second shutter member 41B is opened. Yet furthermore, in a state in which the shutter members 41A, 41B both are opened, for example, the illumination region centered on the optical axis AX on the mask M is illuminated with the light in the circumferentially linearly polarized state from the secondary light source of the quadrupolar shape.

In the fourth embodiment and the fifth embodiment described above, since the optical members in the optical paths (refracting members, reflecting members, diffracting members, polarizing members) remain stationary during the switching of the optical paths by the path switching member, there is the advantage that no change is caused in the illumination state due to movement of any optical member. In the fourth embodiment and the fifth embodiment, the polarization beam splitter 5, 37 may be replaced by an amplitude division type beam splitter that splits incident light into two or more optical paths by amplitude division.

Figure 10:
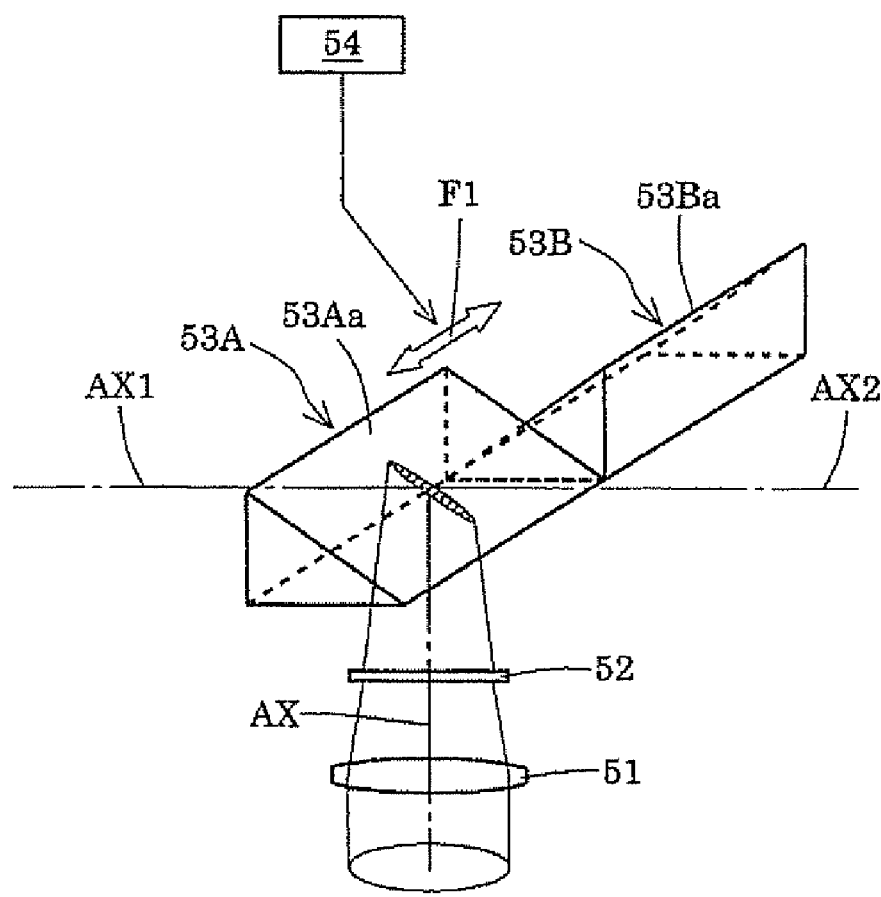
FIG. 10 is a drawing schematically showing a configuration example of a path switching mechanism for switching an optical path of an exiting beam between a first optical path and a second optical path.

In the aforementioned first embodiment the half wave plate 3 and the polarization beam splitter 4 constitute the path switching member; in the second embodiment and the third embodiment the changeover mirror OM constitutes the path switching member; in the fourth embodiment the shutter members 41A, 41B and the polarization beam splitter 37 constitute the path switching member; in the fifth embodiment the shutter members 41A, 41B constitute the path switching member. However, without having to be limited to this, it is also possible, for example, to adopt a configuration example as shown in FIG. 10, as the path switching mechanism to switch the optical path of the exiting beam from the first optical path and the second optical path. With reference to FIG. 10, a beam traveling through a condensing optical system 51, travels through a beam converting element 52 like a diffractive optical element to enter a first right-angle prism 53A. The beam converting element 52 has a function to diffuse the incident beam in one direction only. Therefore, the beam incident along the optical axis AX into the first right-angle prism 53A is reflected in a sectional shape elongated in a direction of inclination on a reflecting surface 53Aa of the prism to become the first beam, and the first beam is guided along the optical axis AX1 of the first optical path.

Since the cross section of the beam incident to the reflecting surface 53Aa of the first right-angle prism 53A is elongated in one direction, the energy density of the incident beam is kept at a sufficiently low level and damage can be avoided to the reflecting surface 53Aa from the irradiation with light. The path switching mechanism shown in FIG. 10 has the first right-angle prism 53A, second right-angle prism 53B, and setting unit 54 which moves the first right-angle prism 53A and the second right-angle prism 53B in directions indicated by arrow F1 in the drawing, to selectively set only either one of the reflecting surface 53Aa of the first right-angle prism 53A and reflecting surface 53Ba of the second right-angle prism 53B in the illumination optical path. Therefore, when the second right-angle prism 53B is moved to the position of the first right-angle prism 53A in the drawing by the action of the setting unit 54 to set the reflecting surface 53Ba in the illumination optical path, the beam incident along the optical axis AX into the second right-angle prism 53B is reflected in a sectional shape elongated in a direction of inclination on the reflecting surface 53Ba, to turn into the second beam, and the second beam is guided along the optical axis AX2 of the second optical path.

In each of the above-described embodiments, when the diffractive optical elements 12, 22 for dipolar illumination are replaced with diffractive optical elements for annular illumination, diffractive optical elements for circular illumination, or diffractive optical elements for other multi-polar illumination in the illumination optical paths, it is feasible to implement any one of annular illumination, circular illumination, and multi-polar illuminations (tripolar illumination, quadrupolar illumination, pentapolar illumination, and so on). Namely, each of the first illumination region and the second illumination region can be illuminated in an optional illumination form selected from the annular illumination, circular illumination, multi-polar illuminations, and so on.

In each of the above-described embodiments, the present invention was explained in association with the double exposures to form one synthetic pattern by superimposing two types of patterns in a single shot area on the photosensitive substrate (wafer). However, without having to be limited to this, the present invention can also be applied similarly to multiple exposures to form one synthetic pattern by superimposing three or more types of patterns in a single shot area on the photosensitive substrate. In each of the above embodiments, one synthetic pattern is formed by the scanning exposures of the first pattern and the second pattern in the superimposed state in one shot area on the photosensitive substrate. However, without having to be limited to this, it is also possible to adopt a method of performing a scanning exposure or one-shot exposure of the first pattern in a first shot area on the photosensitive substrate and then performing a scanning exposure or one-shot exposure of the second pattern in a second shot area on the photosensitive substrate.

Figure 11:
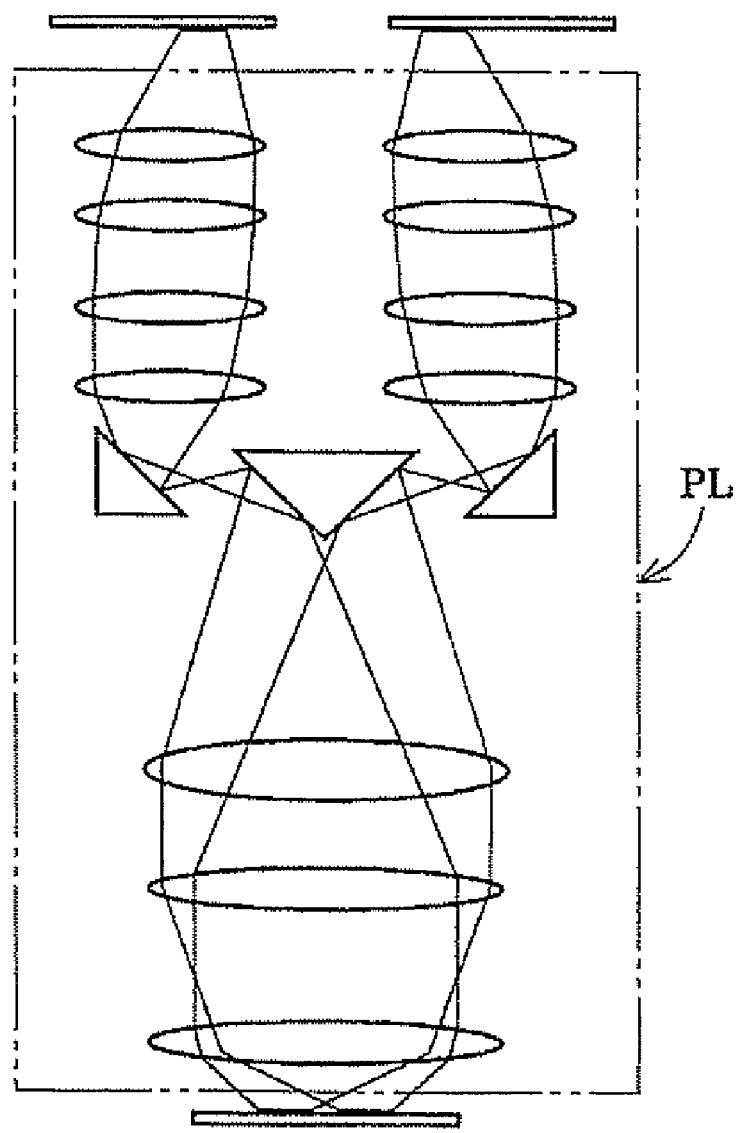
FIG. 11 is a drawing schematically showing a configuration of a double-headed projection optical system consisting of a refracting system and deflecting mirrors.
Figure 12:
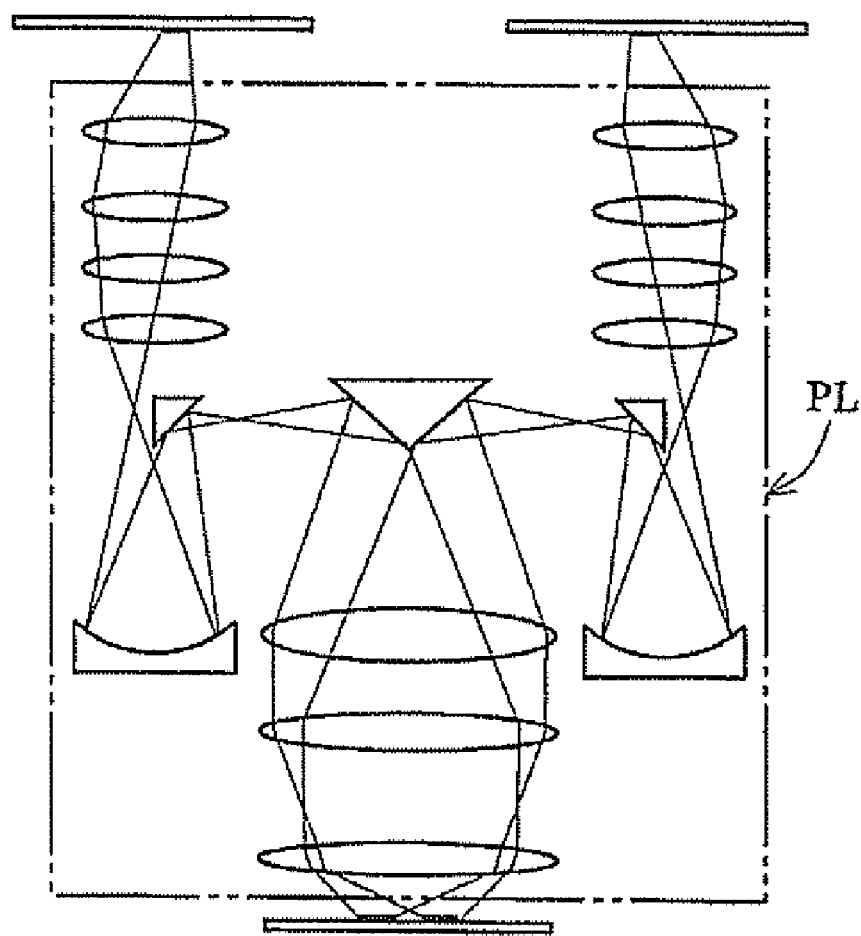
FIG. 12 is a drawing schematically showing a configuration of a catadioptric double-headed projection optical system.
Figure 13:
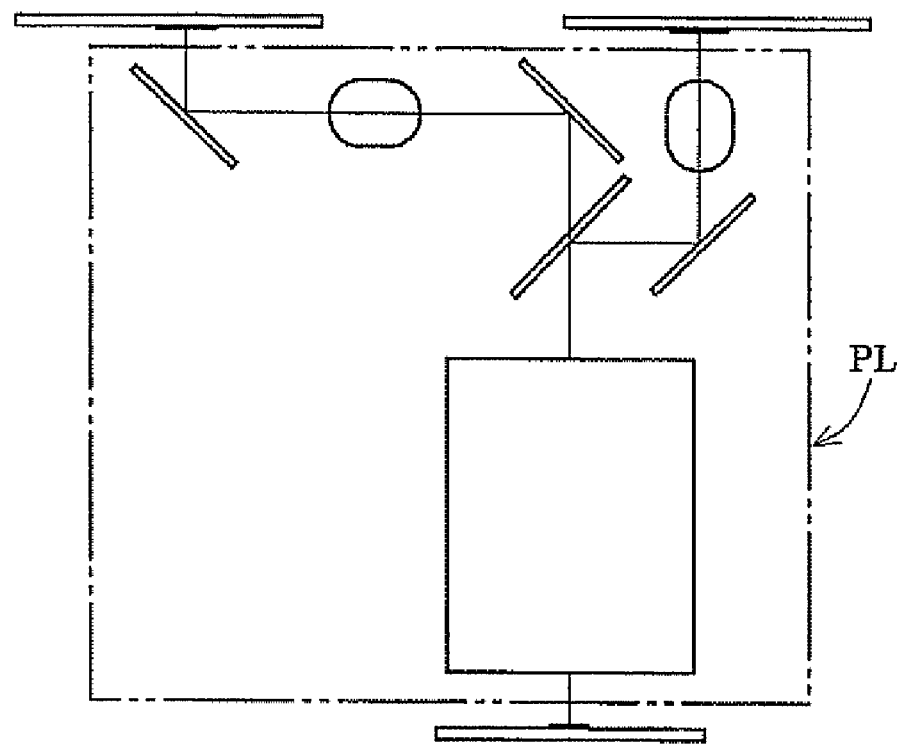
FIG. 13 is a drawing schematically showing a configuration of a double-headed projection optical system using beam splitters.

In each of the above embodiments, the pattern images in two regions on the same mask are formed on the photosensitive substrate. However, without having to be limited to this, it is also possible to form a pattern image in a first illumination region on a first mask and a pattern image in a second illumination region on a second mask, on the photosensitive substrate. In this case, the projection optical system PL applicable can be, for example, a double-headed projection optical system PL consisting of a refracting system and deflecting mirrors as shown in FIG. 11, a catadioptric double-headed projection optical system PL as shown in FIG. 12, or a double-headed projection optical system PL using beam splitters as shown in FIG. 13. Such double-headed projection optical systems applicable herein can be the optical systems proposed in U.S. Pat. Provisional Application No. 60/907,828 and U.S. patent application Ser. No. 12/050,903 corresponding thereto and filed on Mar. 18, 2008. The teachings of U.S. patent application Ser. No. 12/050,903 are incorporated herein by reference.

In the aforementioned embodiments, the mask can be replaced with a pattern forming device which forms a predetermined pattern based on predetermined electronic data. Use of this pattern forming device minimizes the effect on synchronization accuracy even when the pattern surface is vertical. The pattern forming device applicable herein can be, for example, a DMD (Digital Micromirror Device) including a plurality of reflective elements driven based on predetermined electronic data. The exposure apparatus with the DMD is disclosed, for example, in Japanese Patent Applications Laid-open No. 8-313842 and Laid-open No. 2004-304135. Besides the non-emission type reflective spatial optical modulators like the DMD, it is also possible to use a transmissive spatial optical modulator or a self-emission type image display element.

In the foregoing embodiments, it is also possible to apply a technique of filling the optical path between the projection optical system and the photosensitive substrate with a medium having the refractive index lager than 1.1 (typically, a liquid), so called a liquid immersion method. In this case, one of the following methods can be adopted as the technique of filling the optical path between the projection optical system and the photosensitive substrate with the liquid: the technique of locally filling the optical path with the liquid as disclosed in International Publication WO99/49504; the technique of holding the substrate as an object to be exposed, by a stage and moving the stage in a liquid bath as disclosed in Japanese Patent Application Laid-open No. 6-124873; the technique of forming a liquid bath of a predetermined depth on a stage and holding the substrate in the bath as disclosed in Japanese Patent Application Laid-open No. 10-303114. The teachings of International Publication WO99/49504, and Japanese Patent Application Laid-open Nos. 6-124873 and 10-303114 are incorporated herein by reference.

The exposure apparatus of the foregoing embodiments are manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

The exposure apparatus according to the above-described embodiments can be used to manufacture micro devices (semiconductor devices, imaging devices, liquid-crystal display devices, thin-film magnetic heads, etc.) through a process of illuminating a mask (reticle) by the illumination optical apparatus (illumination block) and effecting an exposure of a transfer pattern formed on the mask, on a photosensitive substrate by use of the projection optical system (exposure block). The below will describe an example of a method of manufacturing semiconductor devices as micro devices by forming a predetermined circuit pattern on a wafer or the like as a photosensitive substrate by means of the exposure apparatus of the above embodiments, with reference to the flowchart of FIG. 14.

Figure 14:
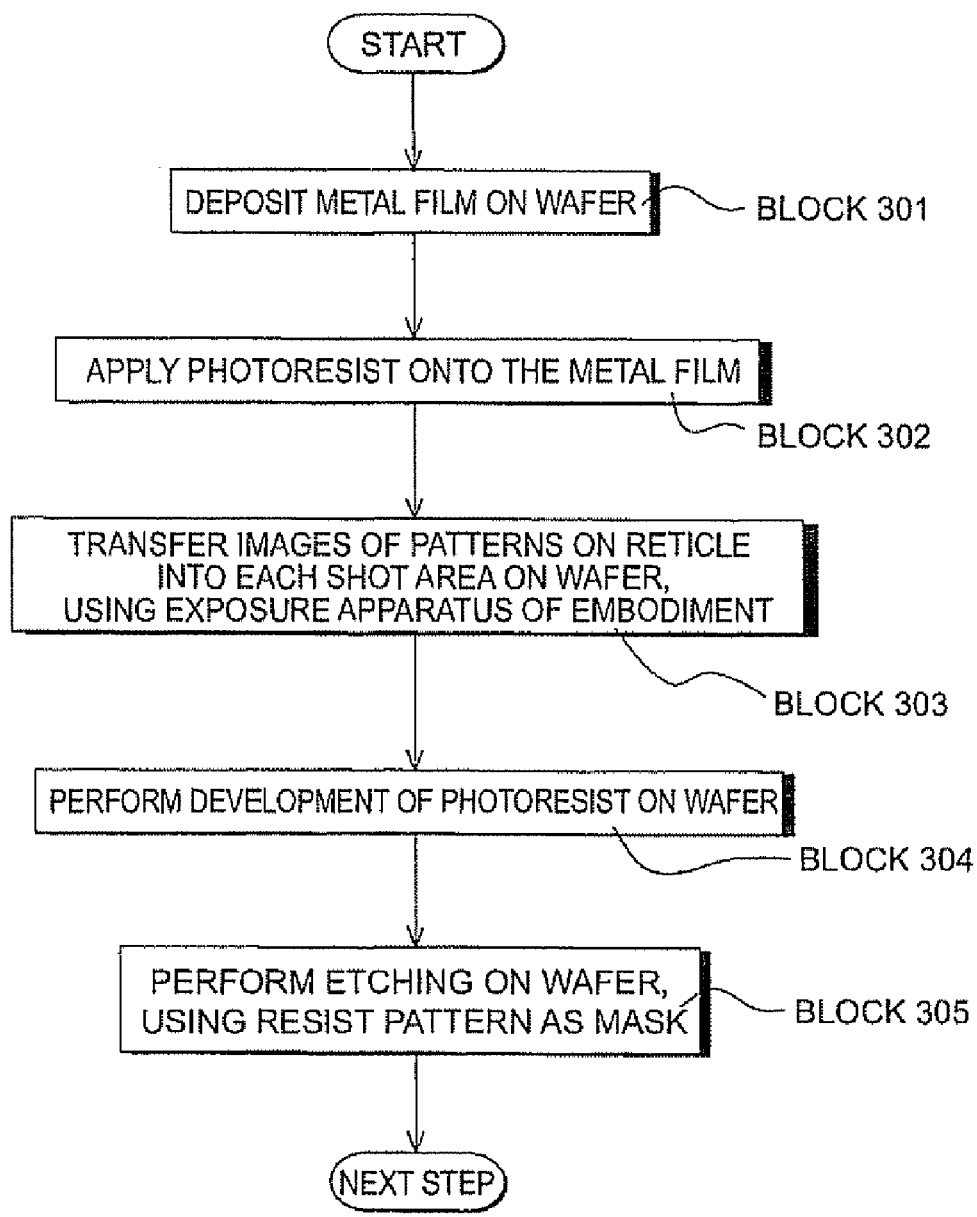
FIG. 14 is a flowchart showing a method for manufacturing semiconductor devices as micro devices.

The first block 301 in FIG. 14 is to deposit a metal film on each wafer in one lot. The next block 302 is to apply a photoresist onto the metal film on each wafer in the lot. The subsequent block 303 is to use the exposure apparatus of the embodiments to sequentially transfer images of patterns on a mask into each shot area on each wafer in the lot through the projection optical system of the exposure apparatus. The subsequent block 304 is to perform development of the photoresist on each wafer in the lot and the next block 305 is to perform etching using the resist pattern as a mask on each wafer in the lot, and thereby to form a circuit pattern corresponding to the patterns on the mask, in each shot area on each wafer.

Thereafter, devices such as semiconductor devices are manufactured through blocks including formation of circuit patterns in upper layers. The above-described semiconductor device manufacturing method permits us to obtain the semiconductor devices with extremely fine circuit patterns at high throughput. The blocks 301-305 are arranged to perform the respective blocks of deposition of metal on the wafer, application of the resist onto the metal film, exposure, development, and etching, but it is needless to mention that the process may be modified as follows: prior to these blocks, an oxide film of silicon is formed on the wafer, a resist is then applied onto the silicon oxide film, and thereafter the blocks of exposure, development and etching are carried out.

Figure 15:
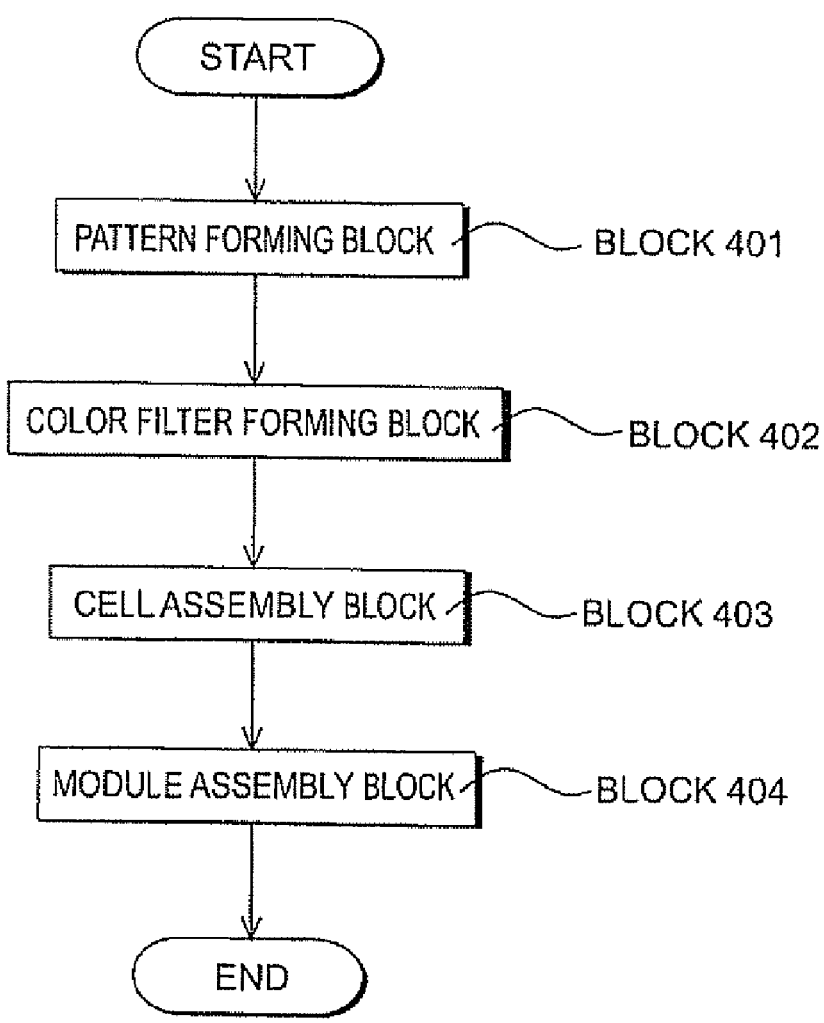
FIG. 15 is a flowchart of a method for manufacturing a liquid-crystal display device as a micro device.

The exposure apparatus of the above embodiments can also be used to manufacture a liquid-crystal display device as a micro device by forming predetermined patterns (circuit pattern, electrode pattern, etc.) on plates (glass substrates). An example of a method in this case will be described below with reference to the flowchart of FIG. 15. In FIG. 15, a pattern forming block 401 is to execute the so-called photolithography block of transferring patterns on a mask onto a photosensitive substrate (a glass substrate coated with a resist or the like) by means of the exposure apparatus of the embodiments. This photolithography block results in forming a predetermined pattern including a large number of electrodes and others on the photosensitive substrate. Thereafter, the exposed substrate is processed through each of blocks including a development block, an etching block, a resist removing block, etc. whereby the predetermined pattern is formed on the substrate, followed by the next color filter forming block 402.

The next color filter forming block 402 is to form a color filter in which a large number of sets of three dots corresponding to R (Red), G (Green), and B (Blue) are arrayed in a matrix pattern or in which sets of filters of three stripes of R, G and B are arrayed in the horizontal scan line direction. After the color filter forming block 402, a cell assembling block 403 is executed. The cell assembling block 403 is to assemble a liquid crystal panel (liquid crystal cell) using the substrate with the predetermined pattern obtained in the pattern forming block 401, the color filter obtained in the color filter forming block 402, and others.

In the cell assembling block 403, the liquid crystal panel (liquid crystal cell) is manufactured, for example, by pouring a liquid crystal into between the substrate with the predetermined pattern obtained in the pattern forming block 401 and the color filter obtained in the color filter forming block 402. The subsequent module assembling block 404 is to attach various components such as electric circuits and backlights for display operation of the assembled liquid crystal panel (liquid crystal cell) to complete the liquid-crystal display device. The above-described manufacturing method of the liquid-crystal display device permits us to obtain the liquid-crystal display device with extremely fine circuit patterns at high throughput.

Each of the illumination optical apparatus of the aforementioned embodiments is able to sequentially and individually illuminate the first region and the second region under required illumination conditions with the shape or size of the light intensity distribution on the illumination pupil as a parameter and, therefore, to quickly perform the switching of the illumination conditions between the illumination in the first region and the illumination in the second region. As a consequence, each of the exposure apparatus of the aforementioned embodiments is able to perform the exposure of the fine pattern at high throughput on the photosensitive substrate by the double exposure method and, therefore, to manufacture good devices at high throughput, using the illumination optical apparatus quickly performing the switching of the illumination conditions between the illumination in the first region and the illumination in the second region.

Each of the aforementioned embodiments used the KrF excimer laser light source or the ArF excimer laser light source as the light source, but the present invention does not have to be limited to these: the present invention can also be applied to the exposure apparatus using any other appropriate light source, e.g., an $F_2$ laser light source. Each of the aforementioned embodiments described the present invention using the examples of illumination optical apparatus mounted on the exposure apparatus and adapted to illuminate the mask, but it is apparent that the present invention can be applied to the generally-used illumination optical apparatus for illuminating any illumination target surface other than the mask. As described above, the present invention is not limited to the above-described embodiments but can be carried out in various configurations without departing from the spirit and scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An illumination optical apparatus which illuminates a surface to be illuminated, comprising:
    a path switching member arranged in a path of illumination light and switching an optical path of an exiting beam between a first optical path and a second optical path;
    a path combining member arranged at an end of the first optical path and an end of the second optical path and combining the first optical path and the second optical path;
    a first pupil distribution forming member arranged in the first optical path and forming a predetermined light intensity distribution on an illumination pupil; and
    a second pupil distribution forming member arranged in the second optical path and forming a predetermined light intensity distribution on the illumination pupil,
    the path switching member comprises a first reflecting mirror which can be switched between a first posture in which the first reflecting mirror reflects an incident beam toward the first optical path and a second posture in which the reflecting mirror reflects the incident beam toward the second optical path;
    the path combining member comprises:
        a second reflecting mirror reflecting a beam incident along the first optical path; and
        a third reflecting mirror reflecting a beam incident along the second optical path; and
    the illumination optical apparatus comprises a polarization changing member arranged in at least one optical path out of the first optical path and the second optical path and changing a polarization state of a beam.

2. The illumination optical apparatus according to claim 1, wherein:
    the path switching member comprises a polarization beam splitter, and a polarization state switching member switching a polarization state of a beam incident to the polarization beam splitter, between two linearly polarized states; and
    the path combining member comprises a polarization beam splitter.

3. The illumination optical apparatus according to claim 1, wherein the path combining member comprises a polarization beam splitter.

4. The illumination optical apparatus according to claim 1, wherein the path switching member comprises:
    a first reflecting surface reflecting the incident beam and emitting the beam along the first optical path;
    a second reflecting surface reflecting the incident beam and emitting the beam along the second optical path; and
    a setting unit selectively setting only either one of the first reflecting surface and the second reflecting surface in an illumination optical path.

5. The illumination optical apparatus according to claim 1, wherein all optical members arranged in the first optical path and all optical members arranged in the second optical path remain stationary during the switching between the first optical path and the second optical path by the path switching member.

6. The illumination optical apparatus according to claim 1, wherein the path switching member comprises:
    a beam separating member separating the incident beam into a first beam traveling along the first optical path and a second beam traveling along the second optical path; and
    a shutter member shutting out either one of the first beam and the second beam as occasion demands.

7. The illumination optical apparatus according to claim 1, further comprising a light source supplying illumination light to the path switching member.

8. The illumination optical apparatus according to claim 1, wherein:
    the first pupil distribution forming member comprises a first changing member changing a shape or size of the light intensity distribution formed on the illumination pupil; and
    the second pupil distribution forming member comprises a second changing member changing a shape or size of the light intensity distribution formed on the illumination pupil.

9. The illumination optical apparatus according to claim 1, further comprising:
    an optical integrator arranged behind the path combining member; and
    a common lightguide optical system guiding the first beam having passed through the first optical path and the optical integrator and the second beam having passed through the second optical path and the optical integrator, to the same illumination region on the illumination target surface.

10. The illumination optical apparatus according to claim 1, wherein the path switching member comprises:
    a polarization beam splitter; and
    a polarization state switching member switching a polarization state of a beam incident to the polarization beam splitter, between two linearly polarized states.

11. An exposure apparatus comprising the illumination optical apparatus as set forth in claim 1, and performing an exposure of a predetermined pattern illuminated by the illumination optical apparatus, on a photosensitive substrate.

12. The exposure apparatus according to claim 11, wherein the predetermined pattern includes a first pattern and a second pattern,
    the exposure apparatus further comprising a projection optical system effecting an exposure of an image of the first pattern on the photosensitive substrate and an exposure of an image of the second pattern on the photosensitive substrate.

13. The exposure apparatus according to claim 12, wherein the exposures of the image of the first pattern and the image of the second pattern are effected in a same shot area on the photosensitive substrate.

14. The exposure apparatus according to claim 12, wherein the exposure of the image of the first pattern is effected in a first shot area on the photosensitive substrate and the exposure of the image of the second pattern is effected in a second shot area on the photosensitive substrate.

15. A device manufacturing method comprising:
effecting the exposure of the predetermined pattern on the photosensitive substrate, using the exposure apparatus as set forth in claim 11;
developing the photosensitive substrate in which the pattern has been transferred, and forming a mask layer in a shape corresponding to the pattern on a surface of the photosensitive substrate; and
processing the surface of the photosensitive substrate through the mask layer.

16. An illumination optical apparatus which illuminates a surface to be illuminated, comprising:
a beam separating member arranged in a path of an incident beam and separating the incident beam into a first beam traveling along a first optical path and a second beam traveling along a second optical path;
a path combining member arranged at an end of the first optical path and an end of the second optical path and combining the first optical path and the second optical path;
a first pupil distribution forming member arranged in the first optical path and forming a predetermined light intensity distribution on an illumination pupil;
a second pupil distribution forming member arranged in the second optical path and forming a predetermined light intensity distribution on the illumination pupil; and
a shutter member shutting out either one of the first beam and the second beam as occasion demands.

17. The illumination optical apparatus according to claim 16, wherein:
each of the beam separating member and the path combining member comprises a polarization beam splitter; and
the shutter member comprises:
a first shutter member shutting out the first beam as occasion demands; and
a second shutter member shutting out the second beam as occasion demands.

18. The illumination optical apparatus according to claim 17, wherein either one of the first optical path and the second optical path comprises an optical delay path.

19. The illumination optical apparatus according to claim 16, wherein:
the first pupil distribution forming member comprises a first changing member changing a shape or size of the light intensity distribution formed on the illumination pupil; and
the second pupil distribution forming member comprises a second changing member changing a shape or size of the light intensity distribution formed on the illumination pupil.

20. The illumination optical apparatus according to claim 16, further comprising:
an optical integrator arranged behind the path combining member; and
a common lightguide optical system guiding the first beam having passed through the first optical path and the optical integrator and the second beam having passed through the second optical path and the optical integrator, to the same illumination region on the illumination target surface.

21. An exposure apparatus comprising the illumination optical apparatus as set forth in claim 16, and performing an exposure of a predetermined pattern illuminated by the illumination optical apparatus, on a photosensitive substrate.

22. The exposure apparatus according to claim 21, wherein the predetermined pattern includes a first pattern and a second pattern,
the exposure apparatus further comprising a projection optical system effecting an exposure of an image of the first pattern on the photosensitive substrate and an exposure of an image of the second pattern on the photosensitive substrate.

23. The exposure apparatus according to claim 22, wherein the exposures of the image of the first pattern and the image of the second pattern are effected in a same shot area on the photosensitive substrate.

24. The exposure apparatus according to claim 22, wherein the exposure of the image of the first pattern is effected in a first shot area on the photosensitive substrate and the exposure of the image of the second pattern is effected in a second shot area on the photosensitive substrate.

25. A device manufacturing method comprising:
effecting the exposure of the predetermined pattern on the photosensitive substrate, using the exposure apparatus as set forth in claim 21;
developing the photosensitive substrate in which the pattern has been transferred, and forming a mask layer in a shape corresponding to the pattern on a surface of the photosensitive substrate; and
processing the surface of the photosensitive substrate through the mask layer.

26. An illumination optical apparatus which illuminates a surface to be illuminated, comprising:
a path switching member arranged in a path of illumination light and switching an optical path of an exiting beam between a first optical path and a second optical path;
a path combining member arranged at an end of the first optical path and an end of the second optical path and combining the first optical path and the second optical path;
a first pupil distribution forming member arranged in the first optical path and forming a predetermined light intensity distribution on an illumination pupil; and
a second pupil distribution forming member arranged in the second optical path and forming a predetermined light intensity distribution on the illumination pupil, wherein
the path switching member comprises:
a first reflecting surface reflecting an incident beam and emitting the beam along the first optical path;
a second reflecting surface reflecting an incident beam and emitting the beam along the second optical path;
a setting unit selectively setting only either one of the first reflecting surface and the second reflecting surface in an illumination optical path; and
a beam converting element making the beam, which has a sectional shape elongated in a direction of inclination of the first and second reflecting surfaces, be incident on the first or second reflecting surface.

27. The illumination optical apparatus according to claim 26, further comprising a light source supplying illumination light to the path switching member.

28. The illumination optical apparatus according to claim 27, wherein:
the first pupil distribution forming member comprises a first changing member changing a shape or size of the light intensity distribution formed on the illumination pupil; and
the second pupil distribution forming member comprises a second changing member changing a shape or size of the light intensity distribution formed on the illumination pupil.

29. The illumination optical apparatus according to claim 27, further comprising:

an optical integrator arranged behind the path combining member; and a common lightguide optical system guiding the first beam having passed through the first optical path and the optical integrator and the second beam having passed through the second optical path and the optical integrator, to the same illumination region on the illumination target surface.

30. An exposure apparatus comprising the illumination optical apparatus as set forth in claim 26, and exposing a predetermined pattern illuminated by the illumination optical apparatus, on a photosensitive substrate.

31. A device manufacturing method comprising:

exposing the predetermined pattern on the photosensitive substrate, using the exposure apparatus as set forth in claim 30; and developing the photosensitive substrate after the exposing.

* * * * *